United States Patent
Takisawa et al.

(10) Patent No.: US 6,706,618 B2
(45) Date of Patent: Mar. 16, 2004

(54) SUBSTRATE PROCESSING APPARATUS, SUBSTRATE SUPPORT APPARATUS, SUBSTRATE PROCESSING METHOD, AND SUBSTRATE FABRICATION METHOD

(75) Inventors: Toru Takisawa, Atsugi (JP); Takao Yonehara, Atsugi (JP); Kenji Yamagata, Sagamihara (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/206,214

(22) Filed: Jul. 29, 2002

(65) Prior Publication Data

US 2002/0182038 A1 Dec. 5, 2002

Related U.S. Application Data

(62) Division of application No. 09/138,802, filed on Aug. 24, 1998, now Pat. No. 6,451,670.

(30) Foreign Application Priority Data

Aug. 27, 1997 (JP) ............................... 9-231132

(51) Int. Cl.⁷ ............................................... H01L 21/76
(52) U.S. Cl. ...................................... 438/457; 438/455
(58) Field of Search .................................. 438/455, 457

(56) References Cited

U.S. PATENT DOCUMENTS

| | | | |
|---|---|---|---|
| 4,603,466 A | 8/1986 | Morley .................... 29/569 R |
| 4,724,222 A | * 2/1988 | Feldman .................... 250/49.2 |
| 4,875,613 A | 10/1989 | Kloucek .................... 228/44.3 |
| 5,171,398 A | 12/1992 | Miyamoto .................. 156/552 |
| 5,281,297 A | 1/1994 | Lee .............................. 156/552 |
| 5,300,175 A | 4/1994 | Gardner et al. ............. 156/285 |
| 5,458,715 A | 10/1995 | Takeuchi et al. ............ 156/241 |
| 5,478,782 A | 12/1995 | Satoh et al. ................ 428/455 |
| 5,564,682 A | * 10/1996 | Tsuji ............................ 269/21 |
| 5,769,991 A | 6/1998 | Miyazawa et al. .......... 156/153 |
| 5,894,984 A | 4/1999 | Sakai .................... 228/180.22 |
| 6,008,113 A | 12/1999 | Ismail et al. ................ 438/615 |

FOREIGN PATENT DOCUMENTS

| | | |
|---|---|---|
| EP | 244137 | 11/1987 |
| EP | 0 383 391 | 8/1990 |
| EP | 415340 | 3/1991 |
| EP | 0 926 706 A2 | 6/1999 |
| JP | 01004013 | 1/1989 |
| JP | 01-135439 | 5/1989 |
| JP | 04-148549 | 5/1992 |
| JP | 04-324613 | 11/1992 |
| JP | 5-90393 | 4/1993 |
| JP | 09-038858 | 2/1997 |

OTHER PUBLICATIONS

IBM Technical Disclosure Bulletin, vol. 33, No. 11; Apr. 1991; "Dry Film Resist Punch and Diaphragm Laminator".
Frank Wattenberg, Derivatives–Introduction–Curved mirrors, Department of Mathematics, Carroll college, Helena, MT 59625 (1995) available at http://www.math.montana.edu/frankw/ccp/calculus/deriv/mirror/learn.html/.

* cited by examiner

Primary Examiner—John Niebling
Assistant Examiner—Christopher Lattin
(74) Attorney, Agent, or Firm—Morgan & Finnegan, LLP

(57) ABSTRACT

The spaces in chuck grooves 3a and 3b are evacuated to chuck the entire surface of a wafer 1 to the chuck surface of a wafer support table 3 and curve the wafer 1. A wafer 2 is horizontally opposed to the wafer 1, and the center of the wafer 2 is pressed by a press pin 6a. The centers of the two wafers 1 and 2 are contacted, and the contact portion gradually spreads to the vicinity of the periphery of a central portion 3c and takes a substantially circular shape. After that, the chuck by the chuck grooves 3a is stopped. Consequently, the wafer 1 flattens, and the entire surfaces of the wafers 1 and 2 are contacted.

29 Claims, 20 Drawing Sheets

PRIOR ART

PRIOR ART

SUBSTRATE PROCESSING APPARATUS, SUBSTRATE SUPPORT APPARATUS, SUBSTRATE PROCESSING METHOD, AND SUBSTRATE FABRICATION METHOD

This is divisional of application Ser. No. 09/138,802, filed Aug. 24, 1998 now U.S. Pat. No. 6,451,670.

BACKGROUND OF THE INVENTION

1. Field of the Invention

The present invention relates to a substrate processing apparatus, a substrate support apparatus, a substrate processing method, and a substrate fabrication method and, more particularly, to a substrate processing apparatus, a substrate support apparatus, and a substrate processing method by which two substrates are overlapped and contacted, and a substrate fabrication method using any of these apparatuses and method.

2. Description of the Related Art

A method of contacting two wafers (substrates) and bonding the contacted wafers by, e.g., anodization, pressing, or heat treatment is suited to the fabrication of a wafer having an SOI structure or the like.

FIGS. 25A and 25B are schematic views showing a part of a process of bonding wafers. In this bonding process, as shown in FIG. 25A, a first wafer 1 is set on a wafer support jig 201 with the bonding surface of the first wafer 1 turned up, and a second wafer 2 is gently overlapped on the first wafer 1 with the bonding surface of the second wafer 2 turned down. In this state, as shown in FIG. 25A, the upper wafer 2 floats by the gas (e.g., air or inert gas) between the wafers.

Next, as shown in FIG. 25B, a press pin 202 presses the center and its vicinity of the upper wafer 2 before the gas between the wafers 1 and 2 is completely discharged. Consequently, air between the central portions of the wafers is pushed toward the periphery to first contact the central portions of the wafers 1 and 2. Thereafter, air between the wafers is gradually pushed toward the periphery to increase the area of the contact portion. Finally, the two wafers are entirely contacted.

This method is useful as a method of contacting two wafers by a simple jig and is also considered as a fundamental technique readily applicable to large-diameter wafers.

Generally, the in-plane uniformity of a wafer becomes difficult to ensure as the diameter of the wafer increases. The above method is expected to be able to solve the problem of this in-plane uniformity even when the method is applied to the fabrication of large-diameter wafers. However, a technique suited to larger diameters is being desired.

SUMMARY OF THE INVENTION

It is an object of the present invention to provide an apparatus and a method of easily contacting large-diameter substrates.

A substrate processing apparatus according to the present invention is a substrate processing apparatus for overlapping and contacting two substrates comprising a support unit for supporting a first substrate, and a press unit for pressing a second substrate opposed to the first substrate supported by the support unit, wherein the support unit can support the first substrate while a predetermined portion of the first substrate is so curved as to separate from the second substrate and is not curved.

In the above substrate processing apparatus, the press unit preferably presses a back surface of the second substrate opposed to the first substrate supported by the support unit.

In the above substrate processing apparatus, it is preferable that the support unit can support the first substrate while a peripheral portion of the first substrate is so curved as to separate from the second substrate and is not curved, and the press unit press a substantially central portion of the second substrate opposed to the first substrate supported by the support unit.

In the above substrate processing apparatus, it is preferable that the supports unit support the first substrate in a curved state until a predetermined time elapses after the press unit starts pressing a back surface of the second substrate, and support the first substrate in an uncurved state thereafter.

In the above substrate processing apparatus, it is preferable that the support unit supports the first substrate in a curved state until a contact portion of the first and second substrates spreads to a predetermined region after the press unit starts pressing a back surface of the second substrate, and supports the first substrate in an uncurved state thereafter.

In the above substrate processing apparatus, the support unit preferably comprises an adjusting unit for adjusting the curve of the first substrate to spread a contact portion of the first and second substrates step by step from a center to a periphery thereof.

In the above substrate processing apparatus, the adjusting unit preferably adjusts the curve of the first substrate to spread the contact portion of the first and second substrates concentrically step by step.

In the above substrate processing apparatus, the support unit preferably comprises a chuck unit for curving the first substrate by chucking a back surface of the first substrate.

In the above substrate processing apparatus, it is preferable that the support unit comprises a support table having a peripheral portion lower than a central portion, and the support table chuck the first substrate.

In the above substrate processing apparatus, the support table preferably comprises a disk-like central portion and one or a plurality of annular peripheral portions.

In the above substrate processing apparatus, it is preferable that the support table comprises a disk-like central portion and an annular peripheral portion, and a chuck surface of the peripheral portion be inclined to a chuck surface of the central portion.

In the above substrate processing apparatus, a chuck surface of the central portion and a chuck surface of the peripheral portion preferably have chuck mechanisms for chucking the first substrate.

In the above substrate processing apparatus, it is preferable that frog-like pins for supporting the first substrate be formed on the chuck surfaces of the central portion and/or the peripheral portion, and the first substrate be chucked by evacuating a space between the pins.

In the above substrate processing apparatus, only a chuck surface of the peripheral portion of the support table preferably has a chuck mechanism for chucking the first substrate.

In the above substrate processing apparatus, the support table of the support unit preferably chucks only a periphery of the first substrate to separate a central portion of the first substrate from a central portion of the support table.

In the above substrate processing apparatus, it is preferable that the apparatus further comprises a substrate manipulation unit for supporting the second substrate with the second substrate opposing the first substrate supported by the support unit, and releasing the second substrate, and the press unit press the second substrate when the substrate manipulation unit releases the second substrate.

In the above substrate processing apparatus, it is preferable that the support unit substantially horizontally support the first substrate, and the substrate manipulation unit substantially horizontally support the second substrate above the first substrate and release the second substrate.

A substrate support apparatus according to the present invention is a substrate support apparatus for supporting one of two substrates when the two substrates are overlapped and contacted comprising a support unit capable of supporting the substrate in a curved state and an uncurved state.

In the above substrate support apparatus, the support unit preferably can support the substrate while a periphery of the substrate is curved and is not curved with respect to a central portion of the substrate.

In the above substrate support apparatus, the support unit preferably supports the substrate first in a curved state and then in an uncurved state.

In the above substrate support apparatus, the support unit preferably comprises an adjusting unit for adjusting the curve of the substrate to spread a contact portion of the supported substrate and the other substrate to be contacted to the substrate step by step from a center to a periphery thereof.

In the above substrate support apparatus, the adjusting unit preferably adjusts the curve of the supported substrate to spread the contact portion concentrically step by step.

In the above substrate support apparatus, the support unit preferably curves the substrate by chucking a back surface of the substrate.

In the above substrate support apparatus, it is preferable that the support unit comprises a support table having a peripheral portion lower than a central portion, and the support table chuck the first substrate.

In the above substrate support apparatus, the support table preferably comprises a disk-like central portion and one or a plurality of annular peripheral portions.

In the above substrate support apparatus, it is preferable that the support table comprises a disk-like central portion and an annular peripheral portion, and a chuck surface of the peripheral portion be inclined to a chuck surface of the central portion.

In the above substrate support apparatus, a chuck surface of the central portion and a chuck surface of the peripheral portion preferably have chuck mechanisms for chucking the substrate.

In the above substrate support apparatus, only a chuck surface of the peripheral surface of the support table preferably has a chuck mechanism for chucking the substrate.

In the above substrate support apparatus, the support table of the support unit preferably chucks only a periphery of the substrate to separate a central portion of the substrate from a central portion of the support table.

A substrate processing method according to the present invention is a substrate processing method of overlapping and contacting two substrates comprising the steps of opposing first and second substrates to each other, pressing the second substrate while a periphery of the first substrate is so curved as to separate from a periphery of the second substrate, and setting the first substrate in an uncurved state after a predetermined time elapses.

A substrate processing method according to the present invention is a substrate processing method of overlapping and contacting two substrates comprising the steps of opposing first and second substrates to each other, pressing the second substrate while a periphery of the first substrate is so curved as to separate from a periphery of the second substrate, and setting the first substrate in an uncurved state after a contact portion of the first and second substrates spreads to a predetermined region.

A substrate processing method according to the present invention is a substrate processing method of overlapping and contacting two substrates comprising the steps of opposing first and second substrates to each other, pressing the second substrate while a periphery of the first substrate is so curved as to separate from a periphery of the second substrate, and adjusting the curve of the first substrate to spread a contact portion of the first and second substrates step by step from a center to a periphery thereof.

A substrate processing method according to the present invention is a substrate processing method of overlapping and contacting two substrates comprising the steps of opposing first and second substrates to each other, pressing the second substrate while a periphery of the first substrate is so curved as to separate from a periphery of the second substrate, and adjusting the curve of the first substrate to spread a contact portion of the first and second substrates concentrically step by step from a center to a periphery thereof.

A substrate processing method according to the present invention is a substrate processing method of overlapping and contacting two substrates comprising the steps of opposing first and second substrates to each other, pressing the second substrate while a predetermined portion of the first substrate is so curved as to separate from the second substrate, and setting the first substrate in an uncurved state after a predetermined time elapses.

A substrate processing method according to the present invention is a substrate processing method of overlapping and contacting two substrates comprising the steps of opposing first and second substrates to each other, pressing the second substrate while a predetermined portion of the first substrate is so curved as to separate from the second substrate, and setting the first substrate in an uncurved state after a contact portion of the first and second substrates spreads to a predetermined region.

A substrate processing method according to the present invention is a substrate processing method of overlapping and contacting two substrates comprising the steps of opposing first and second substrates to each other, pressing the second substrate while a predetermined portion of the first substrate is so curved as to separate from the second substrate, and adjusting the curve of the first substrate to spread a contact portion of the first and second substrates step by step from a center to a periphery thereof.

In each of the above substrate processing methods, a back surface of the second substrate is preferably pressed.

Further objects, features, and advantages of the present invention will become apparent from the following detailed description of embodiments of the present invention with reference to the accompanying chucks.

BRIEF DESCRIPTION OF THE DRAWINGS

FIGS. 24A to 24F are sectional views showing an example of a process of fabricating a wafer having an SOI structure or the like.

DETAILED DESCRIPTION OF THE PREFERRED EMBODIMENTS

Preferred embodiments of the present invention will be described in detail below with reference to the accompanying chucks.

[First Embodiment]

Figure 1:
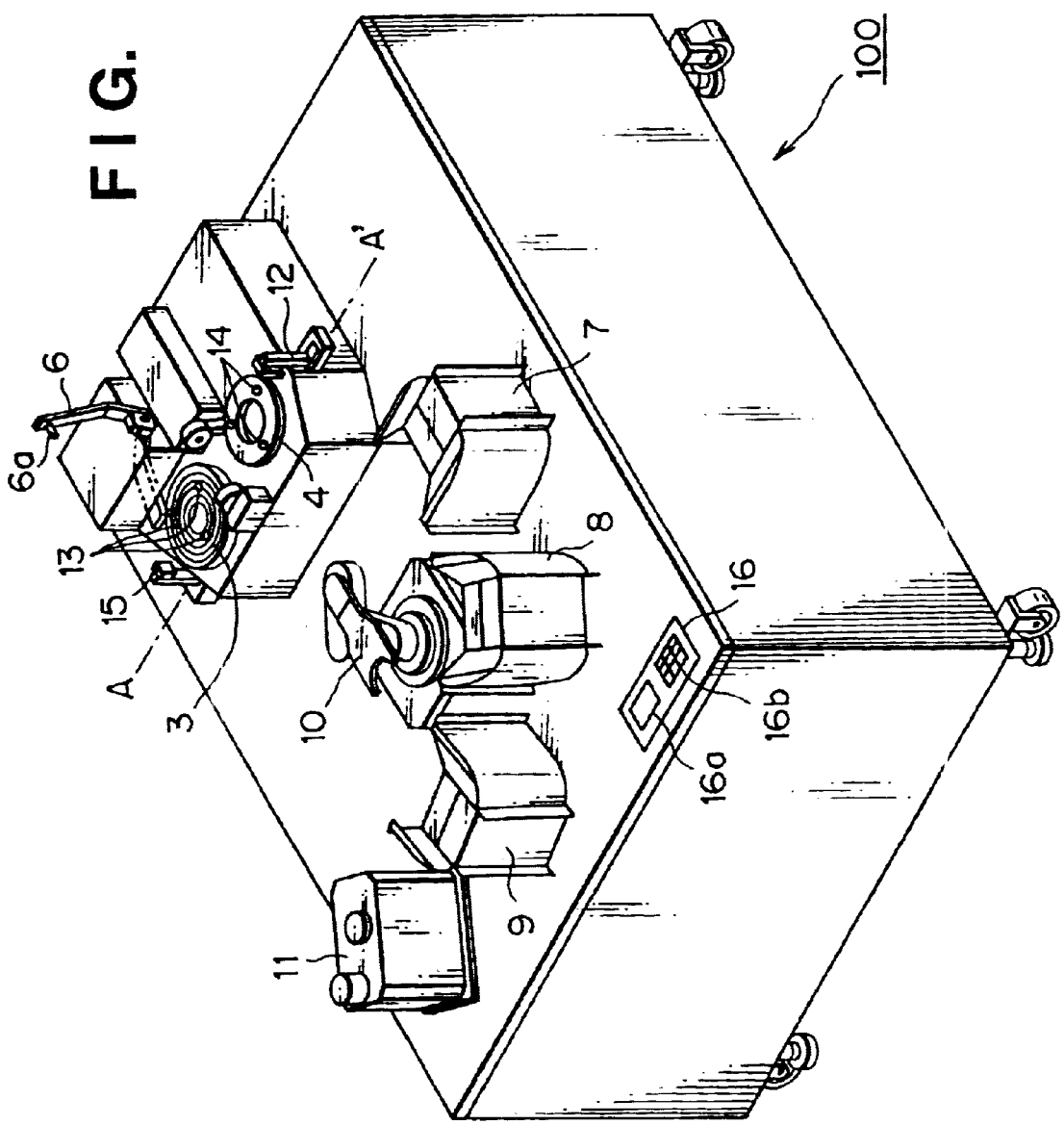
FIG. 1 is a perspective view schematically showing the overall arrangement of a wafer processing apparatus according to one preferred embodiment of the present invention.
Figure 2:
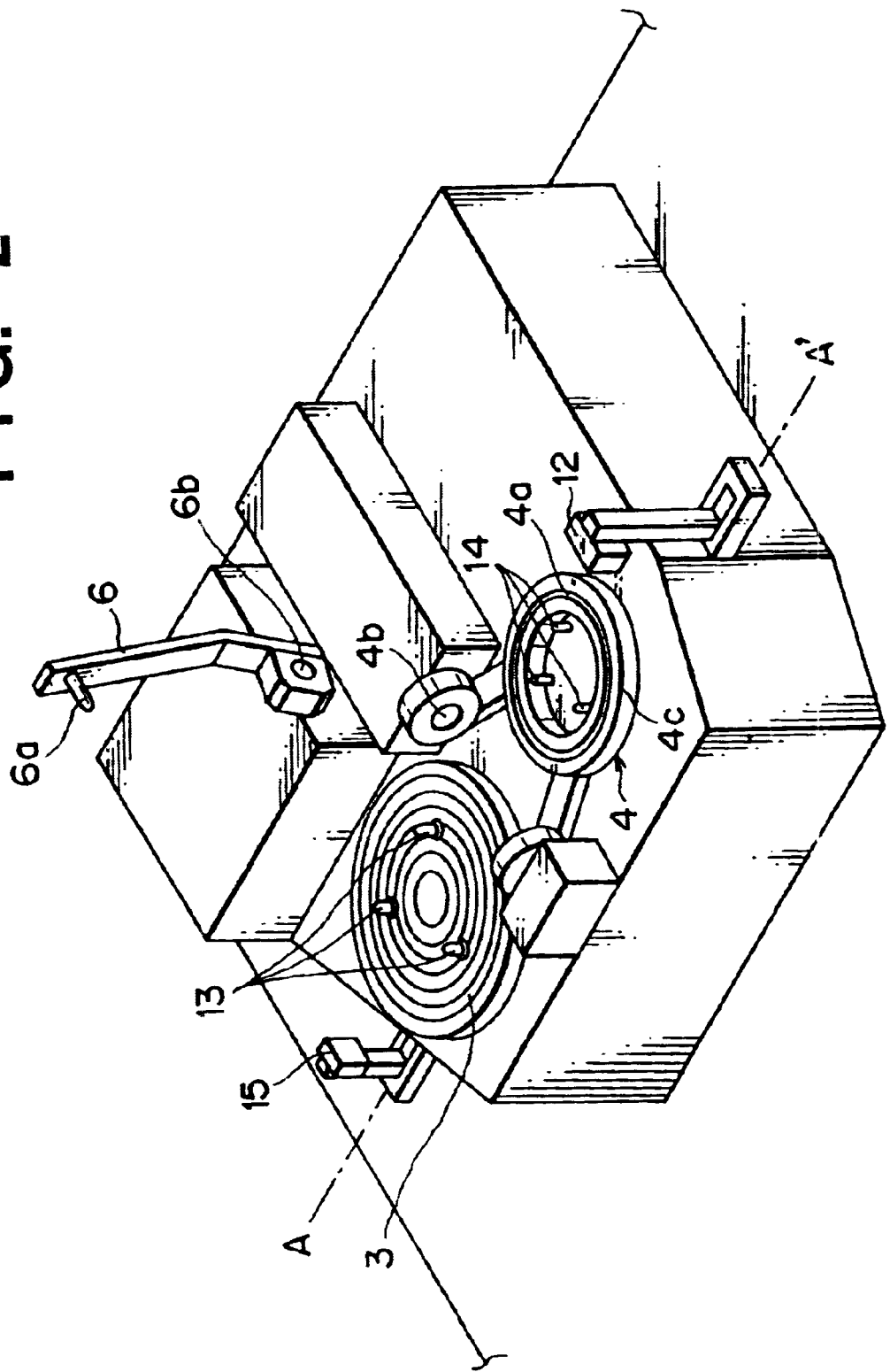
FIG. 2 is an enlarged view of a part of FIG. 1.
Figure 3:
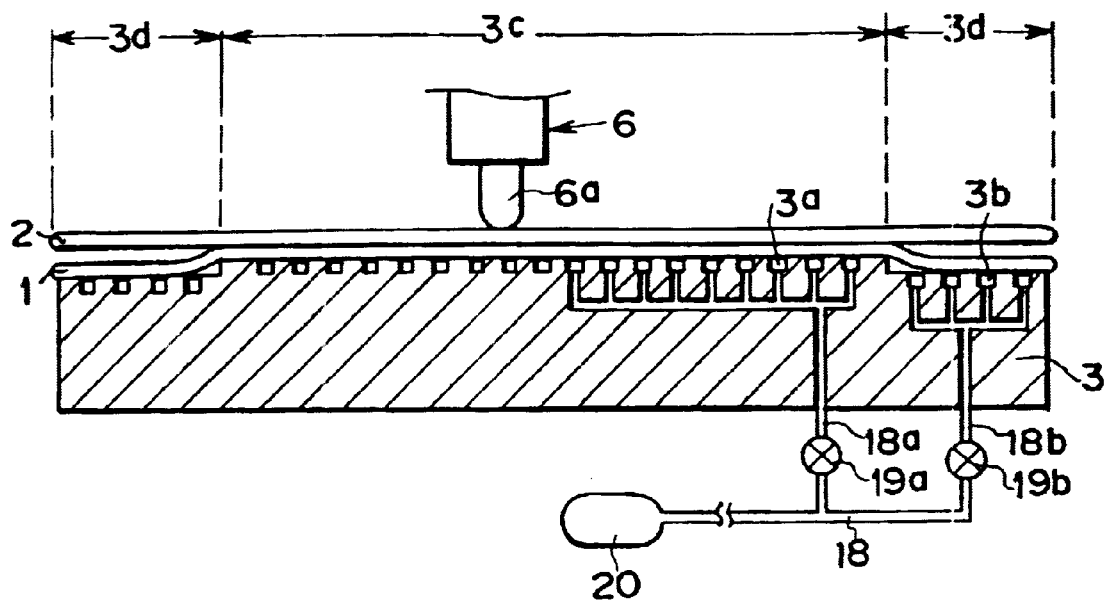
FIG. 3 is a view showing an example of a vacuum chuck mechanism formed in a wafer support table.
Figure 4:
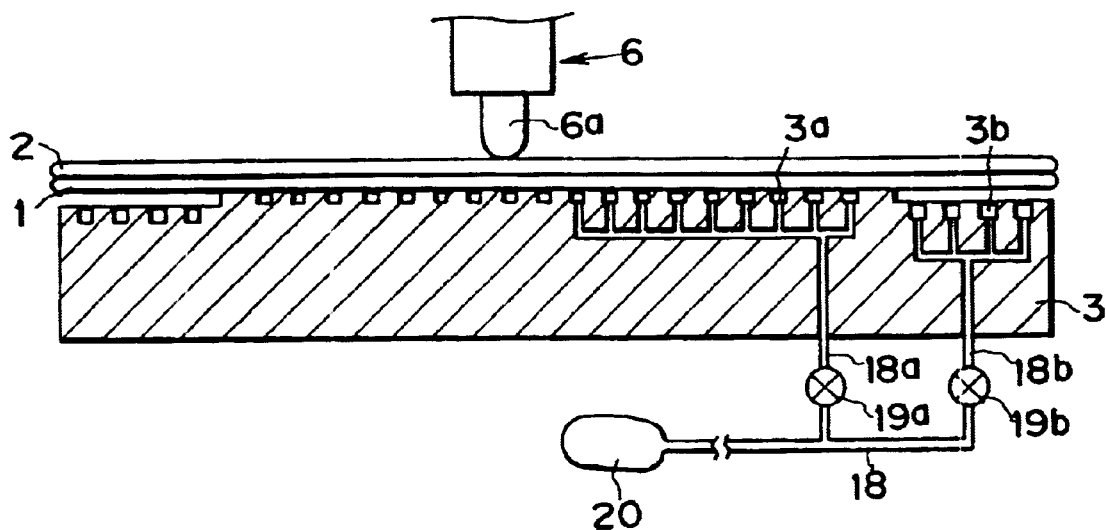
FIG. 4 is a view showing the example of the vacuum chuck mechanism formed in the wafer support table.

FIG. 1 is a perspective view schematically showing the overall arrangement of a wafer processing apparatus 100 according to this embodiment. FIG. 2 is an enlarged view of a part of FIG. 1. FIGS. 3 and 4 are sectional views showing the arrangement of a wafer support unit of the wafer processing apparatus 100 shown in FIGS. 1 and 2. FIGS. 7 to 12 are sectional views taken along a line A–A' of the wafer processing apparatus shown in FIGS. 1 and 2. FIGS. 7 to 12 show operation of contacting two wafers.

This wafer processing apparatus 100 is an apparatus for overlapping and contacting two wafers and suited to carry out a method of fabricating a wafer having an SOI structure or the like by bonding two wafers.

The wafer processing apparatus 100 comprises a wafer support table 3 and a wafer moving mechanism 4. The wafer support table 3 supports the back surface of a first wafer 1 (FIG. 3). The wafer moving mechanism 4 chucks the back surface of a second wafer 2 (FIG. 3) and opposes the second wafer 2 substantially parallel to the first wafer 1.

Figure 11:
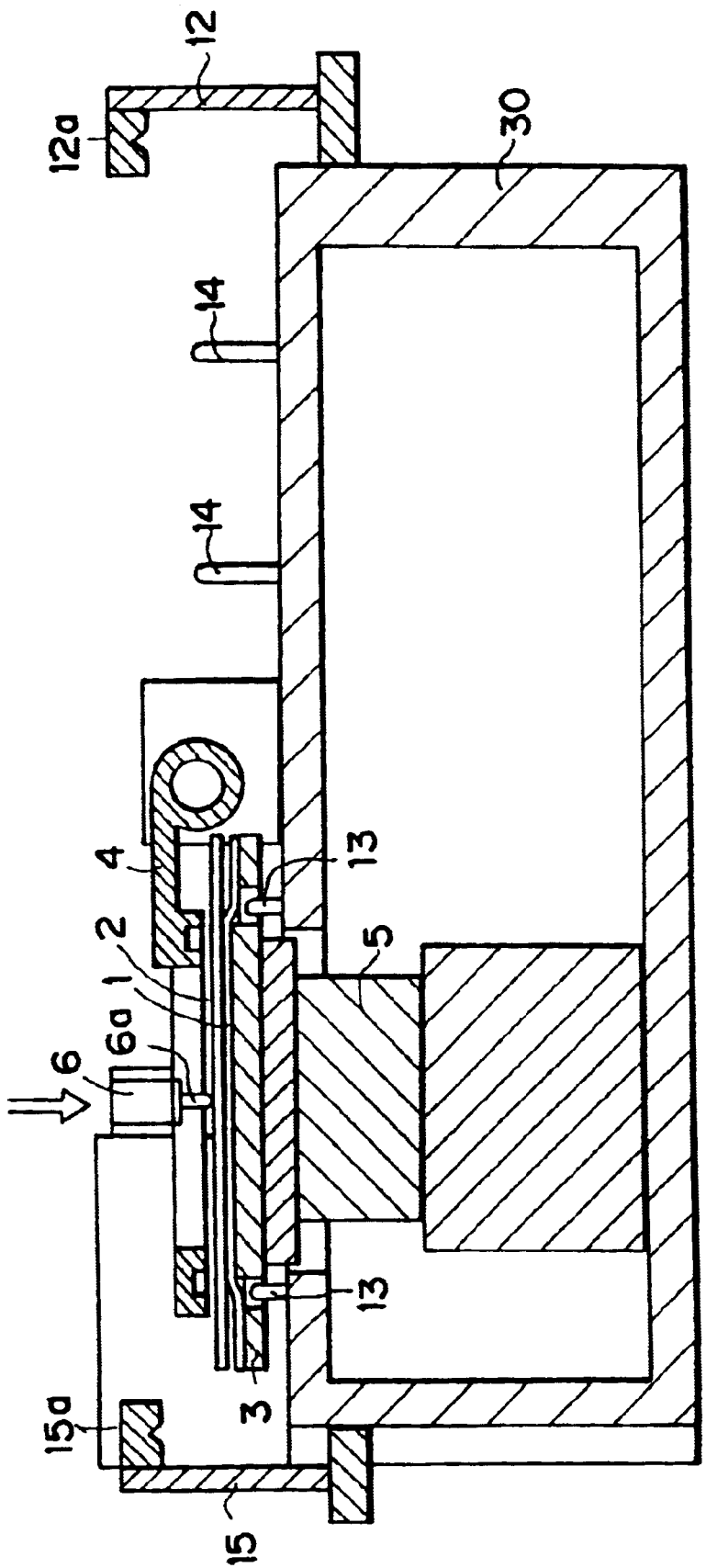
Figure 12:
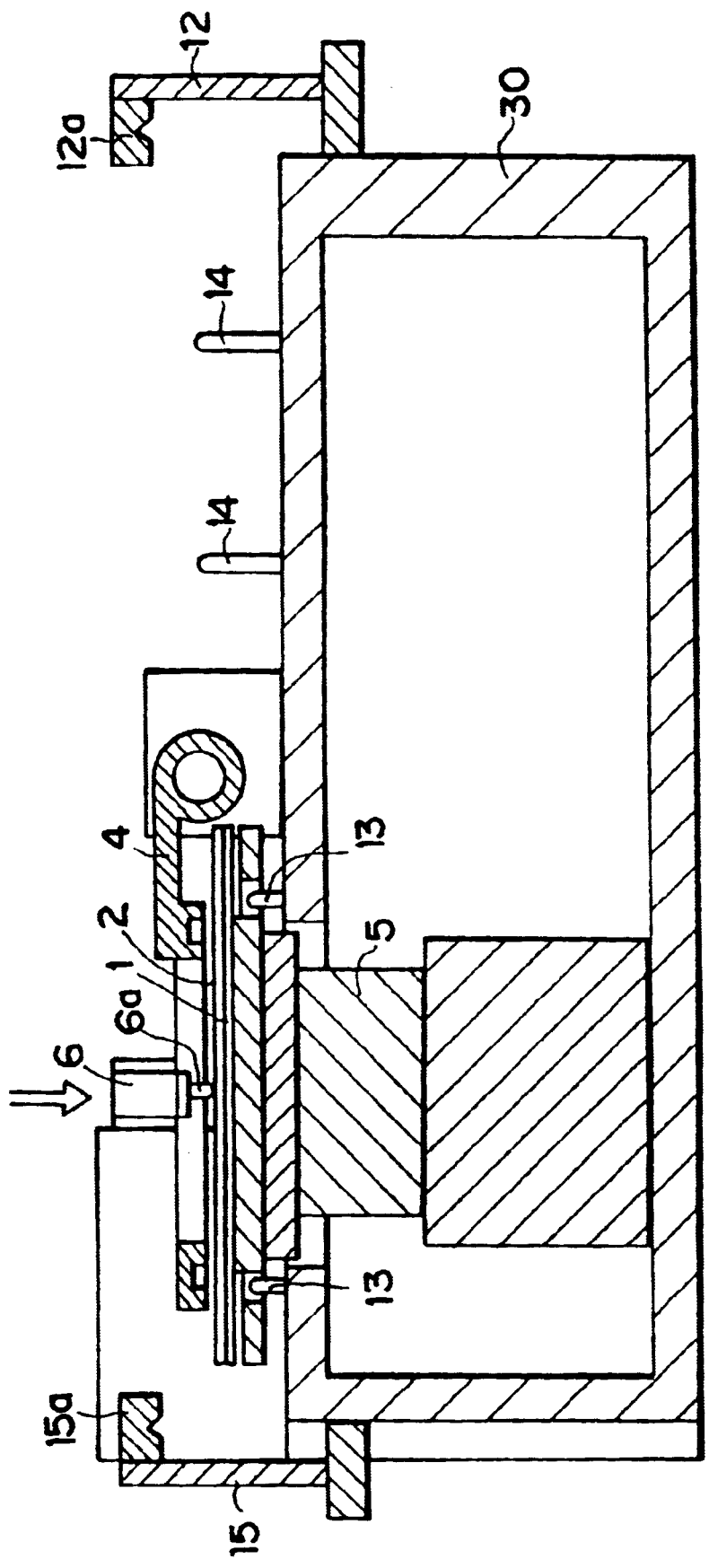

The wafer support table 3 is preferably so constructed as to come in contact only with the back surface of the first wafer 1. This prevents contamination of the first wafer 1 by particles and break of the periphery of the first wafer 1. This wafer support table 3 has a vacuum chuck mechanism for chucking the first wafer 1. FIGS. 3 and 4 show a wafer support mechanism which is pressing the central portion of the wafer 2 with a press pin 6a (FIGS. 11 and 12).

The wafer moving mechanism 4 is preferably so constructed as to come in contact only with the back surface of the second wafer 2. In this embodiment, the wafer moving mechanism 4 has a groove 4a for vacuum-chucking a wafer. To chuck the second wafer 2, it is only necessary to evacuate the space in the groove 4a. While a wafer chuck unit 4c is chucking the back surface of the second wafer 2, the wafer moving mechanism 4 rotates the second wafer 2 through about 180° around a shaft 4b and opposes the second wafer 2 substantially parallel to the first wafer 1. The shaft 4b is positioned substantially halfway between the wafer support table 3 and the wafer chuck unit 4c.

This wafer processing apparatus 100 also comprises displacement detectors 12 and 15 and a Z-axis stage 5 (FIG. 7) as a mechanism for adjusting the gap between the two opposing wafers 1 and 2. The displacement detector 15 measures the thickness of the first wafer 1 after the first wafer 1 is placed on the wafer support table 3. The displacement detector 12 measures the thickness of the second wafer 2 after the second wafer 2 is chucked by the wafer chuck unit 4c. On the basis of the measurement results from the two displacement detectors 12 and 15, the Z-axis stage 5 (FIG. 7) vertically moves the wafer support table 3 to adjust the gap between the wafers 1 and 2 to a set value.

The wafer processing apparatus 100 further comprises a press mechanism 6 for pressing substantially the center of the upper wafer 2 while the two wafers 1 and 2 are so supported as to face each other. After the two wafers 1 and 2 are so supported as to face each other, the press pin 6a of the press mechanism 6 pivots on a shaft 6b to the vicinity of the back surface of the upper wafer 2. When the wafer chuck unit 4c of the wafer moving mechanism 4 releases the upper wafer 2, the press mechanism 6 pushes the press pin 6a against the back surface of the upper wafer 2 to press the back surface. The two wafers 1 and 2 are gradually contacted from the pressed portion toward the periphery. Accordingly, the gas between the wafers 1 and 2 is discharged toward the periphery and prevented from remaining between the wafers 1 and 2.

The wafer 2 is preferably pressed by the press pin 6a at substantially the same time the wafer chuck unit 4c releases the wafer 2. If this is the case, the press operation can be started while the gap between the two wafers 1 and 2 is kept adjusted to a set value. Consequently, the contacted wafers can be given uniform quality. It is also possible to effectively prevent any gas from remaining between the wafers 1 and 2 and prevent misalignment between the wafers 1 and 2.

The press mechanism 6 incorporates a vibrator (e.g., a piezoelectric element) for vibrating the press pin 6a. The press mechanism 6 can efficiently discharge the gas between the wafers 1 and 2 by vibrating the press pin 6a when pressing the wafer 2.

Pressing of the wafer 2 by the press pin 6a can also be controlled at another timing. For example, after the wafer 2 is released, it can be pressed at a predetermined timing before a predetermined amount or more of gas between the wafers 1 and 2 is discharged, when a predetermined time is counted, or at a predetermined timing before the distance between the wafers 1 and 2 is decreased to a predetermined distance or less by the weight of the wafer 2 and the like.

The wafer processing apparatus 100 also comprises a wafer transfer robot 10 and a wafer alignment unit 11. The wafer transfer robot 10 sets the wafers 1 and 2 on the wafer support table 3 and the wafer chuck unit 4c, respectively, and receives the contacted wafers from the wafer support table 3.

In this wafer processing apparatus 100, wafer cassettes 7 and 8 containing unprocessed wafers 1 and 2, respectively, and a wafer cassette 9 for accommodating processed wafers are arranged in each individual predetermined positions. In this embodiment, the unprocessed wafers 1 and 2 are accommodated in the wafer cassettes 7 and 8 with the back surfaces of these wafers turned down.

When the start of a process of contacting wafers is designated by an operation switch 16b of an operation panel 16, the wafer transfer robot 10 chucks the back surface of an unprocessed wafer 1 contained in the wafer cassette 7 and transfers the wafer 1 to the wafer alignment unit 11. The wafer alignment unit 11 detects the central position and the direction (e.g., the position of the orientation flat or notch) of the transferred wafer 1 by using a sensor and adjusts the detected central position and direction. The wafer alignment unit 11 is preferably so constructed as to come in contact only with the back surface of the wafer 1.

After that, the wafer transfer robot 10 receives the wafer 1 thus completely aligned and loads the wafer 1 in a predetermined position on load pins 13 projecting upward from the wafer support table 3. After the wafer 1 is loaded on the load pins 13 in this manner, the wafer support table 3 moves up and supports the wafer 1. The wafer 1 is already aligned by the wafer alignment unit 11 and transferred onto the wafer support table 3 while being kept aligned. Therefore, it is unnecessary to again adjust the central position and direction of the wafer 1 on the wafer support table 3. However, an arrangement by which the wafer 1 is aligned on the wafer support table 3 can also be used.

Next, the wafer transfer robot 10 picks up an unprocessed wafer 2 from the wafer cassette 8. Following the same procedure as above, the wafer alignment unit 11 adjusts the central position and direction of the wafer 2 and loads the wafer 2 in a predetermined position on load pins 14 projecting upward from the wafer chuck unit 4c. After the wafer 2 is thus loaded on the load pins 14, the wafer chuck unit 4c pivots on the shaft 4c and comes in contact with the back surface of the wafer 2. The wafer chuck unit 4c chucks the wafer 2 by evacuating the space in the groove 4a. As in the above procedure, the wafer 2 is already aligned by the wafer alignment unit 11 and chucked by the wafer chuck unit 4c while being kept aligned. This obviates the need for readjusting the central position and direction of the wafer 2 when the wafer 2 is chucked. When the wafer 2 is chucked, it is also effective to retract the load pins 14 downward, instead of pivoting the wafer chuck unit 4c.

While the wafers 1 and 2 are supported by the wafer support table 3 and the wafer chuck unit 4c as described above, the displacement detectors 15 and 12 measure the thicknesses of the wafers 1 and 2. More specifically, the displacement detectors 15 and 12 move sensors 15a and 12a to positions above the wafers 1 and 2, irradiate light onto the wafers 1 and 2, and measure the thicknesses of the wafers 1 and 2 on the basis of the reflected light.

When the measurements of the thicknesses of the wafers 1 and 2 are complete, the wafer chuck unit 4c pivots through around 180° on the shaft 4b as described above and opposes the wafer 2 substantially parallel to the wafer 1. Then, the Z-axis stage 5 adjusts the gap between the wafers 1 and 2, and the press pin 6a presses the wafer 2 to complete the contacting process.

When the contacting process is finished, the wafer support table 3 is moved down by the Z-axis stage 5 to allow the load pints 13 to support the processed wafer. The wafer transfer robot 10 receives the processed wafers and places the wafers into the wafer cassette 9.

By repeatedly executing the above procedures, a plurality of wafers contained in the wafer cassettes 7 and 8 can be successively processed.

The arrangement of the wafer support table 3 will be described below. The wafer support table 3 has a disk-like central portion 3c and an annular peripheral portion 3d. Chuck grooves 3a and 3b for vacuum-chucking the wafer 1 are formed in the chuck surfaces (the surfaces for chucking the wafer 1) of the central portion 3c and the peripheral portion 3d, respectively. In the embodiment shown in FIGS. 3 and 4, the chuck grooves 3a are nine concentric annular grooves, and the chuck grooves 3b are four concentric annular grooves.

The chuck grooves 3a and 3b are connected to chuck holes 18a and 18b, respectively, and further connected to valves 19a and 19b, respectively. These valves 19a and 19b are connected to a vacuum pump 20 through a pipe 18. Wafer chuck operations by the chuck grooves 3a and 3b can be independently controlled by the valves 19a and 19b which can be separately opened and closed.

The chuck mechanism for the wafer 1 can take various forms. One preferable example is a mechanism which supports the wafer 1 by pins arranged in the form of a frog and evacuates the space between these pins to chuck the wafer 1 to the chuck surface of the wafer support table 3. This chuck mechanism alleviates the influence (e.g., poor planarity of the wafer 1) of particles and the like between the wafer 1 and the wafer support table 3. One example of this chuck mechanism when the size of a wafer is 8 inches is a chuck mechanism in which the diameter of each pin is about 0.2 mm and the distance (pitch) between pins is about 2.2 mm. In this mechanism, the contact ratio between the wafer and the wafer support table is approximately 1.2%.

To press the wafer 2 by the press pin 6a, both of the valves 19a and 19b are opened to chuck the wafer 1 by both of the chuck grooves 3a and 3b. Consequently, as shown in FIG. 3, the peripheral portion 3d of the wafer 1 curves as to separate from the wafer 2, i.e., the wafer 1 warps into the shape of an umbrella.

In this state, the central portion of the wafer 2 is pressed as shown in FIG. 3. Consequently, the central portions of the wafers 1and 2 contact, and the contact portion gradually spreads toward the periphery. The spread of the contact portion stops when it spreads substantially uniformly to the vicinity of the periphery of the central portion 3c throughout the entire circumference. This is so because the wafer 1 is supported while being warped into the shape of an umbrella.

The spread of the contact portion from the center to the periphery of the wafer does not always proceed at the same rate throughout the entire circumference. This is so because, e.g., the bonding surfaces of the wafers 1 and 2 are uneven, and the force acting in the direction in which the wafers 1 and 2 are contacted decreases from the center to the periphery, which increases the influence of the nonuniformity of wafers in the direction from the center to the periphery.

If the spread of the contact portion does not proceed at the same rate, i.e., if the contact portion does not concentrically spread, a gas (e.g., air) can remain between the wafers. This phenomenon is considered to become more pronounced as the diameter of wafers increases.

When, however, the wafer 1 is pressed while it is warped into the shape of an umbrella as shown in FIG. 3A, the spread of the contact portion of the two wafers 1 and 2 once stops near the periphery of the central portion 3c. Accordingly, the nonuniformity of the spread rate of the contact portion is absorbed near the periphery of the central portion 3c. As a consequence, the contact portion is formed into a substantially circular shape.

After the contact portion takes a substantially circular shape (e.g., when a predetermined time elapses after the start of pressing), the valve 19b is closed to stop chucking by the chuck grooves 3b. Consequently, the wafer 1 that had warped into the shape of an umbrella flattens as shown in FIG. 4. Accordingly, the contact portion again spreads from the central portion 3c toward the periphery.

As described above, the difference between the spread rates of the contact portion in all directions (entire periphery) from the center to the periphery is absorbed in the middle of the wafer contacting process. After the contact portion is formed into a substantially circular shape in this manner, the process is continued. Therefore, even large-diameter wafers can be contacted more uniformly.

FIGS. 5A to 5F are views conceptually showing the way the contact portion spreads when the wafer processing apparatus 100 contacts two wafers. Referring to FIGS. 5A to 5F, the spread of the contact portion proceeds in the order of 5A→5B→5C→5D→5E→5F. In FIGS. 5A to 5F, each hatched region indicates the contact portion of the two wafers.

Figures 5A, 5B, 5C:
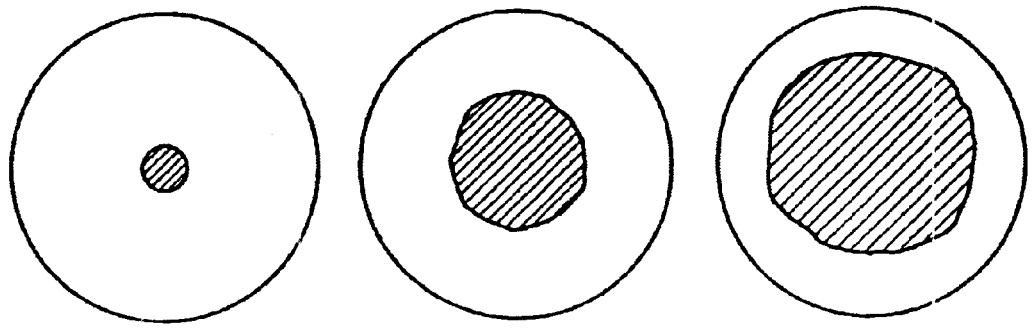
FIGS. 5A to 5F are views conceptually showing the way a contact portion spreads when two wafers are contacted by the wafer processing apparatus.

When the press pin 6a starts pressing the center of the wafer 2 while the entire surface of the lower wafer (wafer 1) is chucked as shown in FIG. 3, a contact portion is first formed in the center of the wafers as shown in FIG. 5A and gradually spreads as shown in FIGS. 5B and 5C. The shape of this contact portion is not a perfect circle. That is, as shown in FIG. 5C, the periphery of the contact portion is often uneven.

Figures 5D, 5E, 5F:
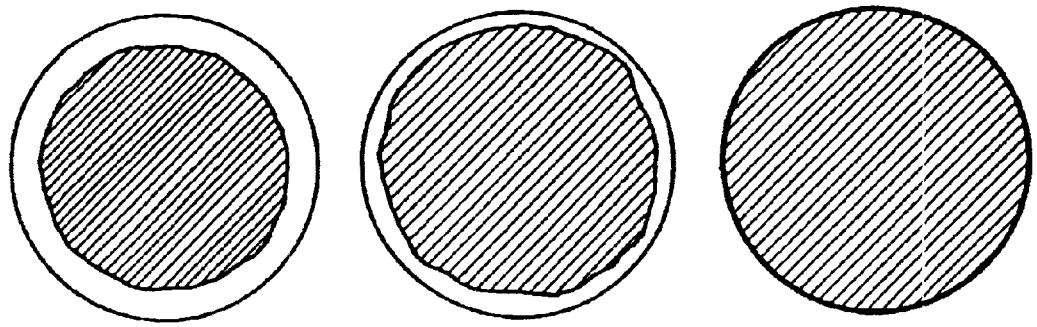

The spread of the contact portion stops in the state shown in FIG. 5D, i.e., when the spread proceeds to the vicinity of the periphery of the central portion 3c of the wafer support table 3 (a position where the spread of the contact portion stops will be referred to as a contact boundary hereinafter). Hence, the contact portion can be formed into a substantially circular shape by continuously chucking the wafer by the chuck grooves 3b in the peripheral portion 3c until the contact portion reaches the contact boundary throughout the entire circumference.

Next, as shown in FIG. 4, the valve 19b connected to the chuck grooves 3b in the peripheral portion is closed to release the periphery of the wafer. Consequently, the lower wafer (wafer 1) flattens. Accordingly, as shown in FIG. 5E, the spread of the contact portion again proceeds. Finally, as shown in FIG. 5F, the entire surfaces of the two wafers are contacted.

Figure 25A:
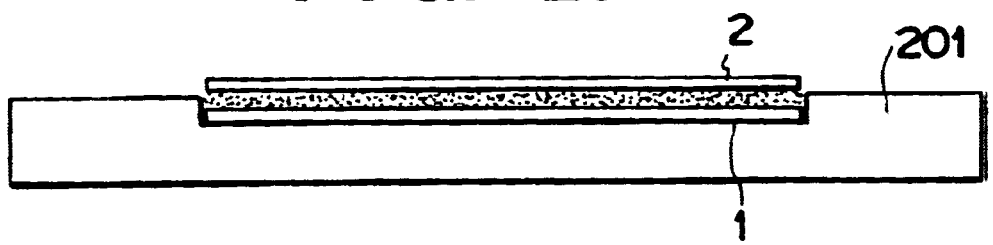
FIGS. 25A and 25B are schematic views showing a part of a process of bonding wafers.
Figure 25B:
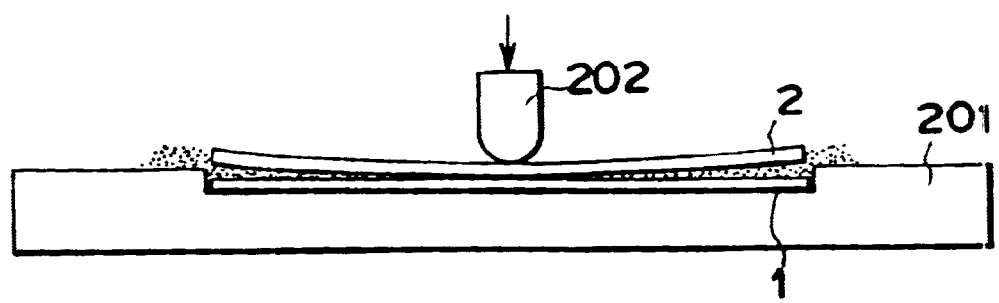

FIGS. 6A to 6F are views conceptually showing the way the contact portion spreads when a wafer support jig 201 shown in FIGS. 25A and 25B contacts two wafers. Referring to FIGS. 6A to 6F, the spread of the contact portion proceeds in the order of 6A→6B→6C→6D→6E→6F.

Figures 6A, 6B, 6C:
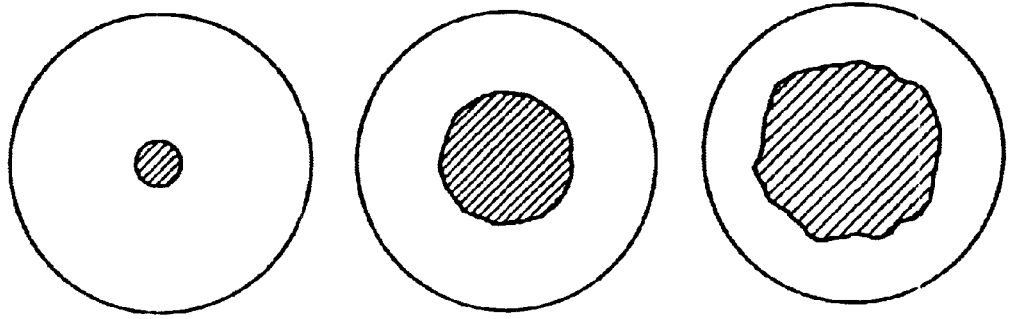
FIGS. 6A to 6F are views conceptually showing the way a contact portion spreads when two wafers are contacted by a conventional wafer processing apparatus.
Figures 6D, 6E, 6F:
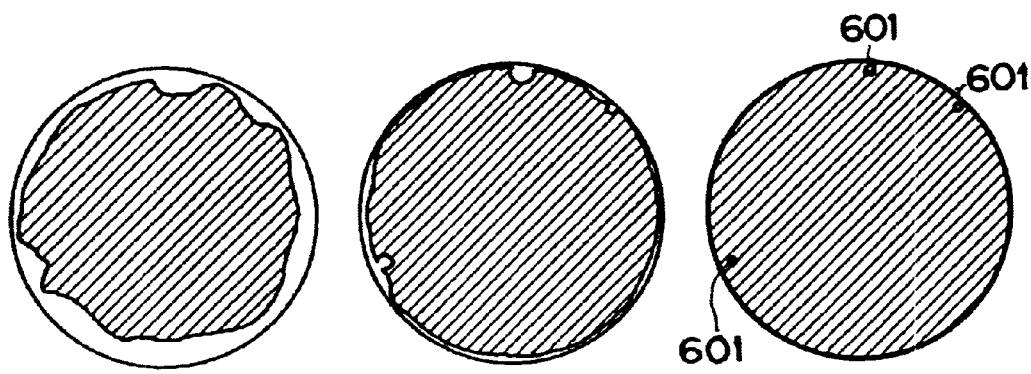

In this process, the difference between the spread rates in all directions when the contact portion radially spreads is not absorbed in the middle of the process. The influence of the rate difference becomes conspicuous particularly near the peripheries of the wafers. Consequently, as shown in FIG. 6F, any gas between the wafers may remain without being discharged to form non-contact portions 601. However, the example shown in FIGS. 6A to 6F shows the result when wafers are contacted under the same conditions as the wafer processing apparatus 100 except for the method of supporting the wafer 1. Therefore, the formation of the non-contact portions 601 may be suppressed by changing the conditions of the contacting process.

This non-contact portion 601 naturally has an adverse effect on subsequent steps. For example, when the wafer processing apparatus 100 is applied to SOI wafer fabrication steps (to be described later), defects occur in the non-contact portions 601, so these regions cannot be used. This unavoidably lowers the yield.

The operation of the wafer processing apparatus 100 when two wafers are contacted will be described below with reference to FIGS. 7 to 12.

Figure 7:
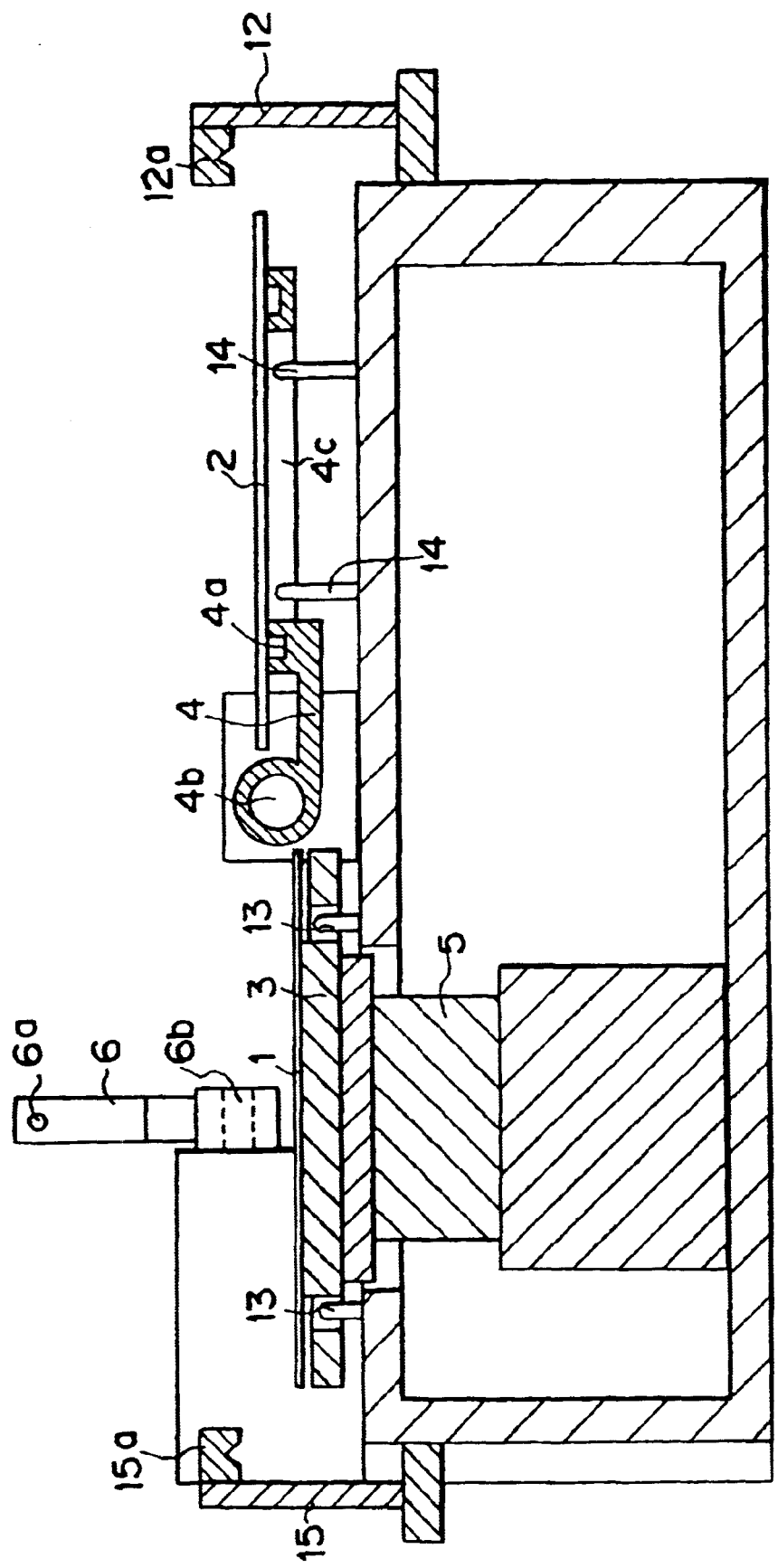
FIGS. 7 to 12 are sectional views taken along a line A–A' of the wafer processing apparatus shown in FIGS. 1 and 2.

When the wafer transfer robot 10 loads wafers 1 and 2 on the load pints 13 and 14, respectively, as shown in FIG. 7, the Z-axis stage 5 moves the wafer support table 3 up to a predetermined position where the wafer 1 is supported. Also, the wafer moving mechanism 4 pivots the wafer chuck unit 4c on the shaft 4b to a predetermined position where the wafer 2 can be chucked.

Figure 8:
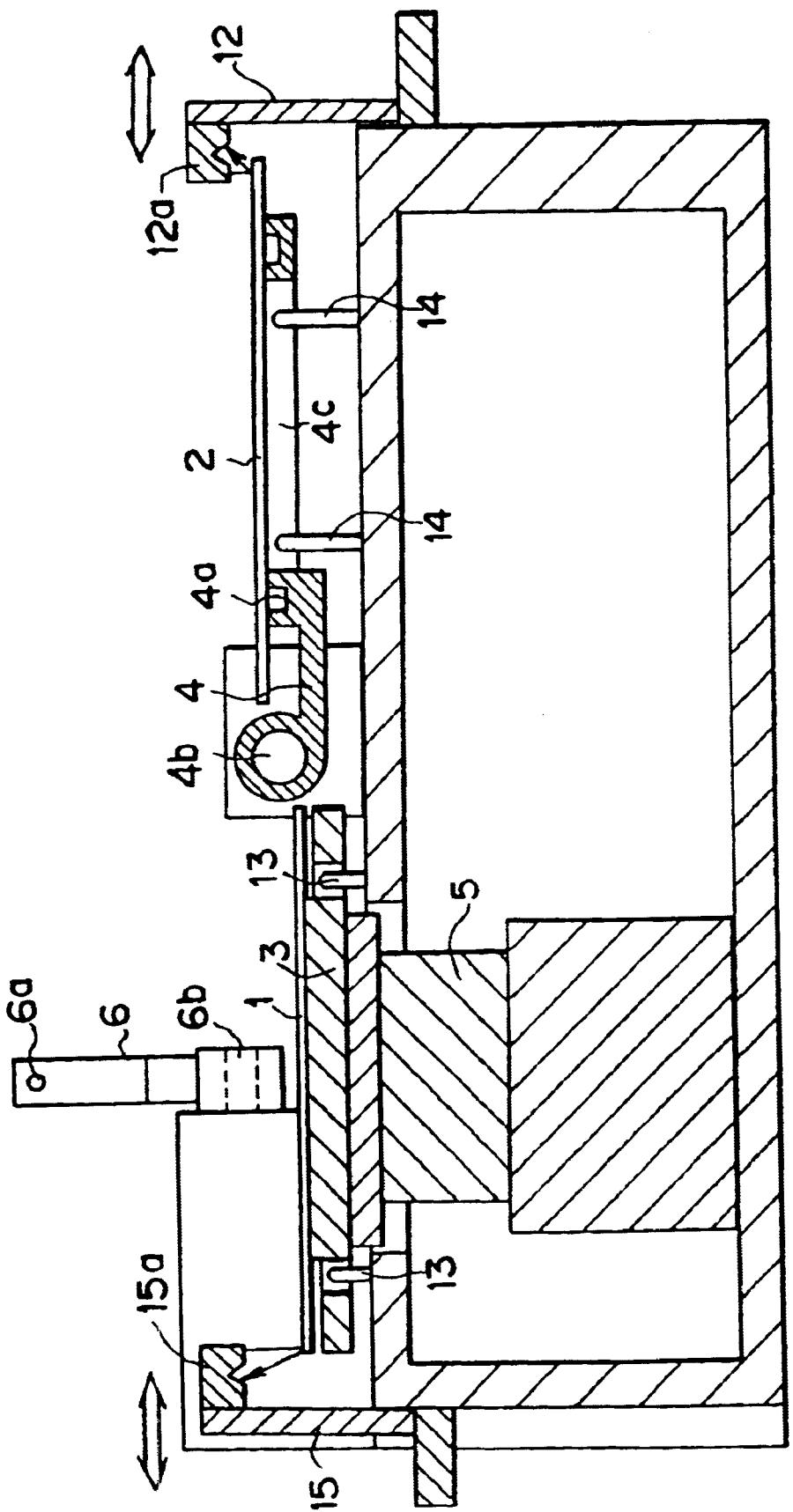

Next, as shown in FIG. 8, the sensors 15a and 12a of the displacement detectors 15 and 12 move to positions above the wafers 1 and 2 and measure the thicknesses of the wafers 1 and 2, respectively. After the thicknesses of the wafers 1 and 2 are measured, the sensors 15a and 12a return to the initial positions shown in FIG. 7.

Figure 9:
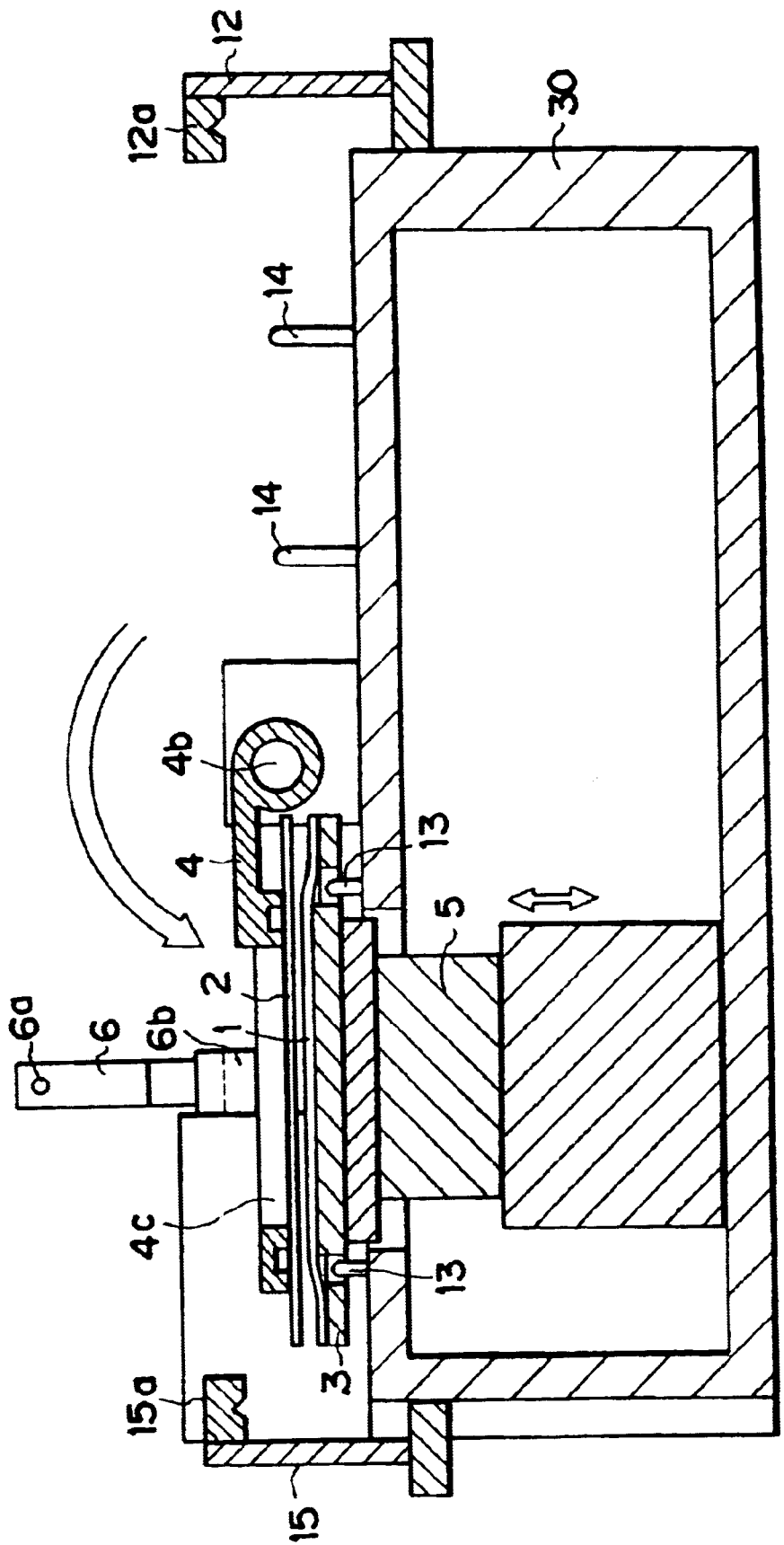

As shown in FIG. 9, the wafer moving mechanism 4 pivots the wafer chuck unit 4c through about 180° on the shaft 4b to oppose the wafers 1 and 2 to each other substantially horizontally. On the basis of the previously measured thicknesses of the wafers 1 and 2, the Z-axis stage 5 adjusts the height of the wafer support table 3 to adjust the gap between the wafers 1 and 2 to a set value. This gap is preferably about 20 to 100 μm, and more preferably, about 30 to 60 μm in the center of a wafer. Also, the valves 19a and 19b are opened to chuck the entire surface of the wafer 1 to the chuck surface of the wafer support table 3. Consequently, the wafer 1 warps into the shape of an umbrella as mentioned earlier.

Figure 10:
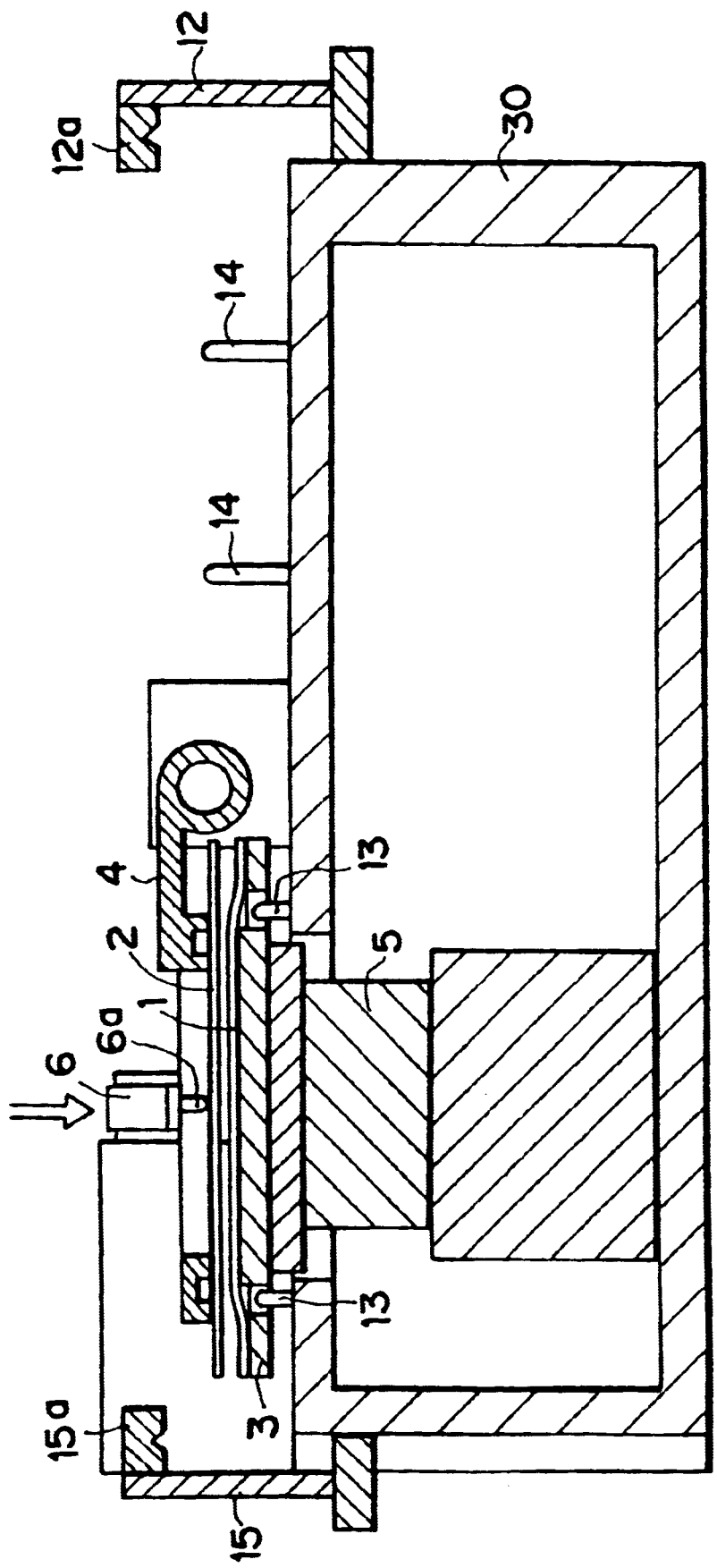

As shown in FIG. 10, the press pin 6a is pivoted on the shaft 6b to the vicinity of the back surface of the wafer 2 (e.g., a position where the press pin 6a essentially comes in contact with the back surface of the wafer 2).

Next, as shown in FIG. 11, the press pin 6a presses the back surface of the wafer 2 at the same time the wafer chuck unit 4c releases the wafer 2. Consequently, the wafers 1 and 2 are gradually contacted from the center to the contact boundary to result in the state shown in FIG. 5D, i.e., the state wherein the contact portion is formed into a substantially circular shape. During pressing, the gas between the wafers 1 and 2 can be efficiently discharged by vibrating the press pin 6a.

As shown in FIG. 12, the periphery of the wafer 1 is released. Consequently, the contact portion of the wafers 1 and 2 spreads beyond the contact boundary to the periphery. Note that the periphery of the wafer 1 can be released by setting the atmospheric pressure in the chuck grooves 3b by closing the valve 19b. This release needs to be performed after the contact portion spreads to the contact boundary and takes a substantially circular shape after the press pin 6a starts the pressing operation. More specifically, the chuck is stopped when a predetermined time (long enough to allow the contact portion to spread to the contact boundary throughout the entire circumference) elapses after the pressing operation is started. Alternatively, the chuck is stopped after the contact portion is found to have spread to the contact boundary by measuring the warp of the wafer 2 by the sensor 15a.

After the press mechanism 6 is returned to the original state (shown in FIG. 2), the wafer chuck unit 4c is returned to the original state (shown in FIG. 2). The valve 19a is closed to set the pressure in the chuck grooves 3a at the atmospheric pressure (release the wafer 1). The wafer support table 3 is moved down to allow the load pins 13 to support the contacted wafers. In this state the wafer transfer robot 10 chucks the lower portion of the contacted wafers, transfers the wafers to the wafer cassette 9, and places the wafers in the wafer cassette 9.

Figure 13:
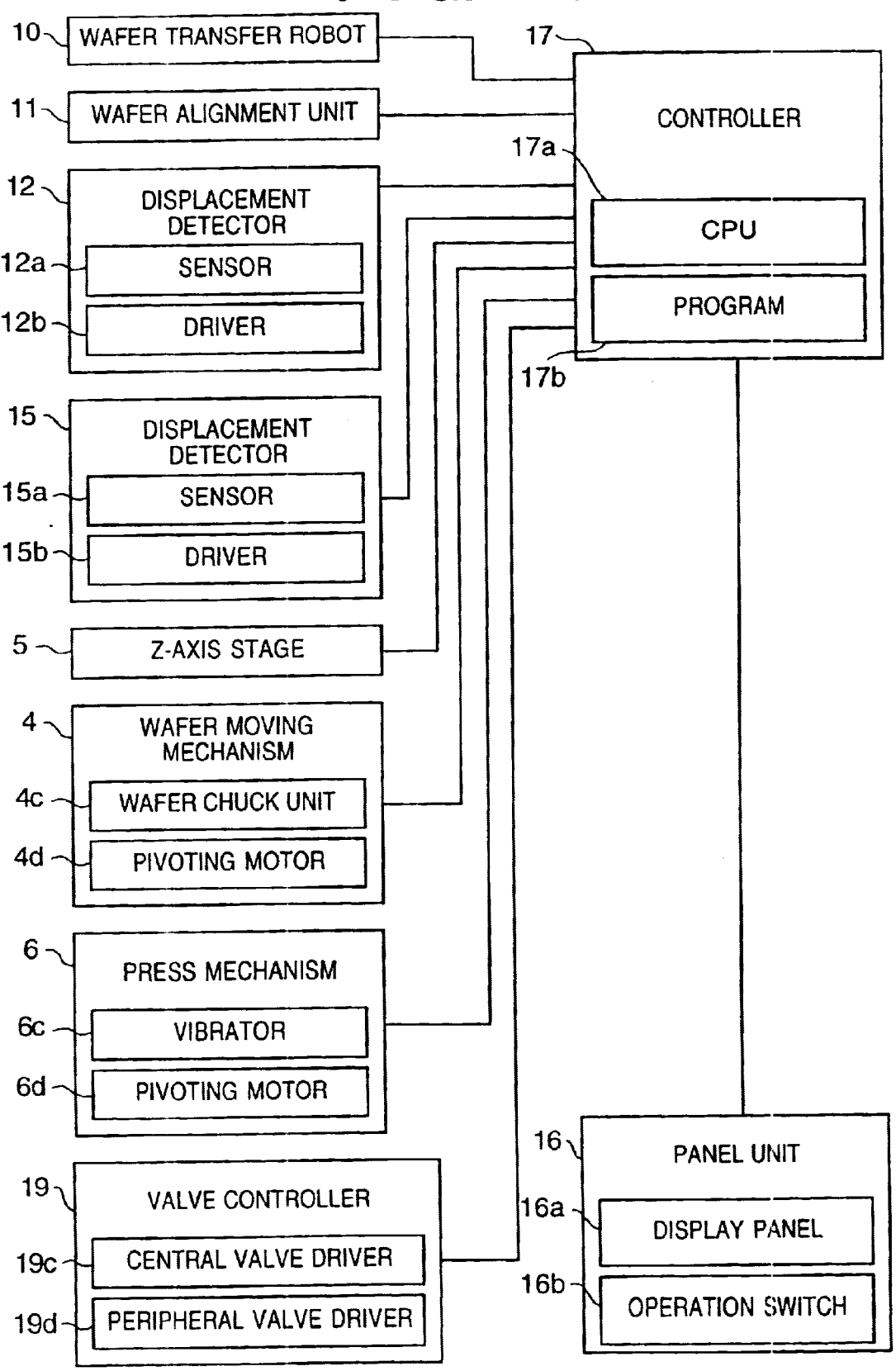
FIG. 13 is a block diagram showing the configuration of a control system of the wafer processing apparatus.

FIG. 13 is a block diagram showing the configuration of a control system of the wafer processing apparatus 100. A CPU 17a operating on the basis of a program 17b of a controller 17 controls the wafer transfer robot 10, the wafer alignment unit 11, the displacement detectors 12 and 15, the Z-axis stage 5, the wafer moving mechanism 4, the press mechanism 6, the operation panel 16, and a valve controller 19.

Figure 14:
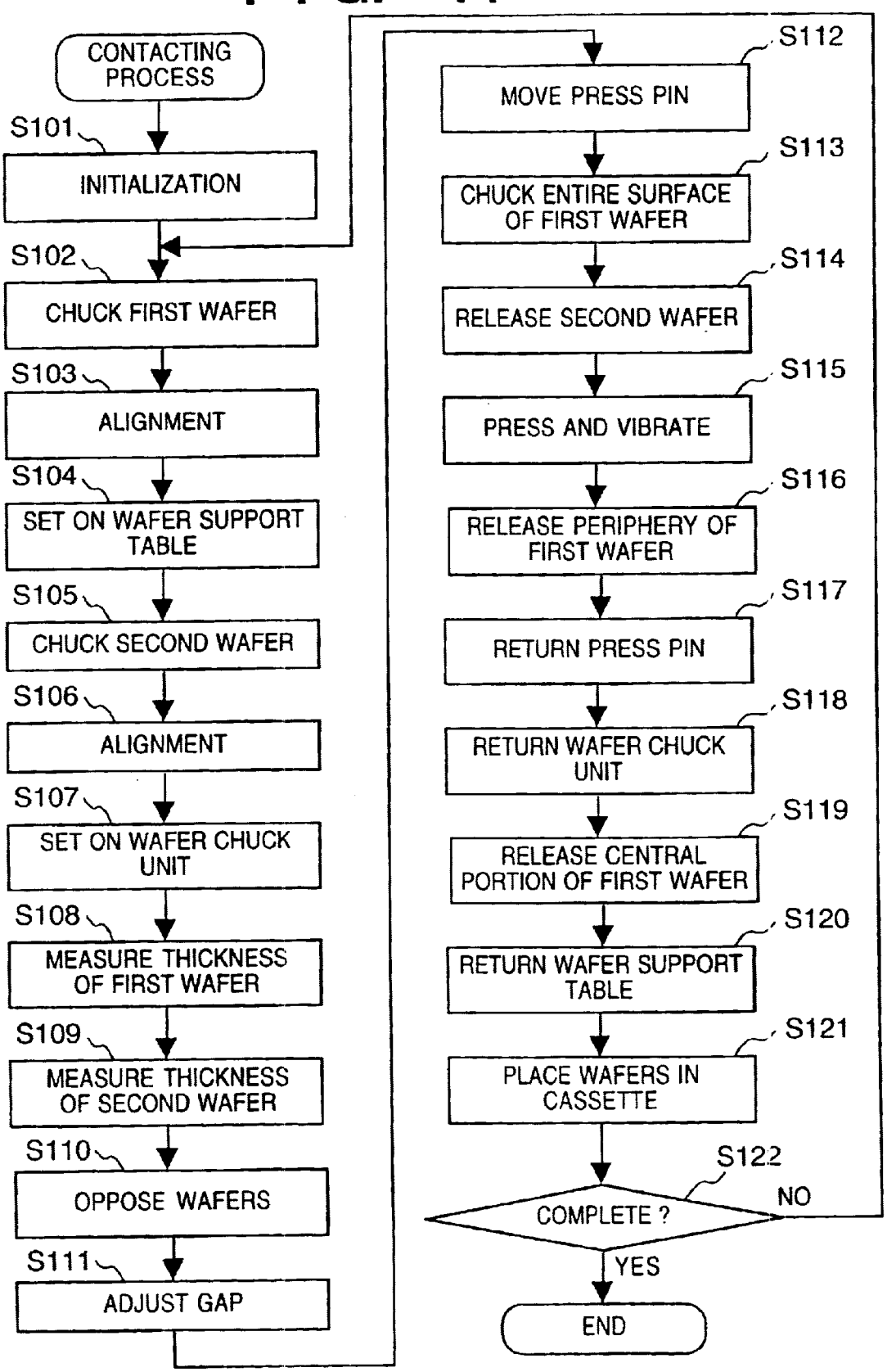
FIG. 14 is a flow chart showing a control procedure of the wafer processing apparatus.

FIG. 14 is a flow chart showing a control procedure performed on the basis of the program 17b. The operation of the control system of the wafer processing apparatus 100 will be described below with reference to this flow chart.

When the start of a contacting process is designated by operating the operation panel 16, the CPU 17a initializes the individual components connected to the controller 17 in step S101. In this initialization step, the CPU 17a also checks the presence and positions of the wafer cassettes 7, 8, and 9. If preparations are not complete, the CPU 17a displays information indicating this on a display panel 16a to inform the operator of the information.

In step S102, the CPU 17a controls the wafer transfer robot 10 to chuck the wafer 1 in the wafer cassette 7. In step S103, the CPU 17a transfers the chucked wafer 1 to the wafer alignment unit 11 and aligns (adjusts the central position and direction of) the wafer 1. In step S104, the CPU 17a controls the wafer transfer robot 10 to load the wafer 1 in a predetermined position on the load pins 13 projecting upward from the wafer support table 3. The CPU 17a also controls the Z-axis stage 5 to move the wafer support table 3 up to a predetermined position. The CPU 17a opens the valve 19a to chuck the central portion of the wafer 1.

In step S105, the CPU 17a controls the wafer transfer robot 10 to chuck the wafer 2 in the wafer cassette 8. In step S106, the CPU 17a transfers the wafer 2 to the wafer alignment unit 11 and aligns (adjusts the central position and direction of) the wafer 2. In step S107, the CPU 17a controls the wafer transfer robot 10 to load the wafer 2 in a predetermined position on the load pins 14 projecting upward from the wafer chuck unit 4c. The CPU 17a also controls a pivoting motor 4d of the wafer moving mechanism 4 to pivot the wafer chuck unit 4c through a predetermined angle on the shaft 4b and allow the wafer chuck unit 4c to chuck the wafer 2.

In step S108, the CPU 17a controls a driver 15b of the displacement detector 15 to move the sensor 15a to a predetermined position above the wafer 1 and measure the thickness of the wafer 1 by the sensor 15a.

In step S109, the CPU 17a controls a driver 12b of the displacement detector 12 to move the sensor 12a to a predetermined position above the wafer 2 and measure the thickness of the wafer 2 by the sensor 12a.

In step S110, the CPU 17a controls the pivoting motor 4d of the wafer moving mechanism 4 to pivot the wafer chuck unit 4c through approximately 180° on the shaft 4b to oppose the wafers 1 and 2 to each other substantially horizontally.

In step S111, on the basis of the measured thicknesses of the wafers 1 and 2 the CPU 17a forms data for adjusting the gap between the wafers 1 and 2 to a set value. On the basis of this data, the CPU 17a controls the Z-axis stage 5 to adjust the gap between the wafers 1 and 2.

In step S112, the CPU 17a controls a pivoting motor 6d of the press mechanism 6 to pivot the press pin 6a on the shaft 6b to, e.g., bring the tip of the press pin 6a essentially into contact with the back surface of the wafer 2.

In step S113, the CPU 17a opens the valve 19b to chuck the entire surface of the wafer 1 to the chuck surface of the wafer support table 3. Consequently, the wafer 1 warps into the shape of an umbrella.

In step S114, the CPU 17a releases the wafer 2 by the wafer chuck unit 4c. In step S115, the CPU 17a controls the pivoting motor 6d and a vibrator 6c of the press mechanism 6 to press the back surface of the wafer 2 by the press pin 6a and vibrate the press pin 6a. By executing step S115 immediately after the execution of step S114, the wafer 2 can be released and pressed at substantially the same time. However, the press can also be started when a predetermined time is counted after the execution of step S114.

When a predetermined time elapses after the execution of step S115 is started, the flow advances to step S116. In step S116, the CPU 17a closes the valve 19b to return the pressure in the chuck grooves 3b to the atmospheric pressure and release the periphery of the wafer 1. Consequently, the wafer 1 flattens, and the contact portion spreads toward the periphery.

When the wafers 1 and 2 are completely contacted, the flow advances to step S117, and the CPU 17a controls the pivoting motor 6d of the press mechanism 6 to return the press pin 6a to the initial position. In step S118, the CPU 17a controls the pivoting motor 4d of the wafer moving mechanism 4 to return the wafer chuck unit 4c to the initial position.

In step S119, the CPU 17a closes the valve 19a to completely release the wafer 1. In step S120, the CPU 17a controls the Z-axis stage 5 to move the wafer support table 3 down to the initial position. Consequently, the contacted wafers are supported by the load pins 13.

In step S121, the CPU 17a controls the wafer transfer robot 10 to transfer the contacted wafers to the wafer cassette 9 and places the wafers in the wafer cassette 9.

In step S122, the CPU 17a checks whether the contacting process is completely performed for all wafers contained in the wafer cassettes 7 and 8. If unprocessed wafers remain, the flow returns to step S102 to repeat the process. If the CPU 17a determines in step S122 that the contacting process is completely performed for all wafers, the CPU 17a completes the whole process procedure. The CPU 17a preferably informs the operator of the completion by, e.g., displaying information to this effect on the display panel 16a or by using a buzzer.

In this wafer processing apparatus as described above, the peripheries of two wafers are separated in the form of a ring, and substantially the center of one wafer is pressed. When the contact portion of the two wafers takes a substantially circular shape, the spread of the contact portion is once stopped. This absorbs the nonuniformity of the spread rate of the contact portion. Accordingly, the gas between the two wafers can be efficiently and reliably discharged.

This wafer processing apparatus 100 also achieves the following effects. 1) Since the press is started at the same time the upper wafer 2 is released, gas between the wafers 1 and 2 can be reliably discharged toward the periphery. 2) The two wafers 1 and 2 can be accurately aligned because the upper wafer 2 does not slide when the wafers 1 and 2 are opposed to each other. 3) The gap between the wafers 1 and 2 can be adjusted to an appropriate distance. Consequently, it is possible to give uniform quality to the fabricated wafers and obviate the need for sorting the wafers 1 and 2 in advance. 4) The surfaces of the wafers 1 and 2 can be prevented from being contaminated with particles. 5) Break of the periphery of a wafer can be prevented. 6) By giving vibrations to wafers when the wafers are pressed, any gas that remains between the wafers can be further reduced.

[Second Embodiment]

Figure 15:
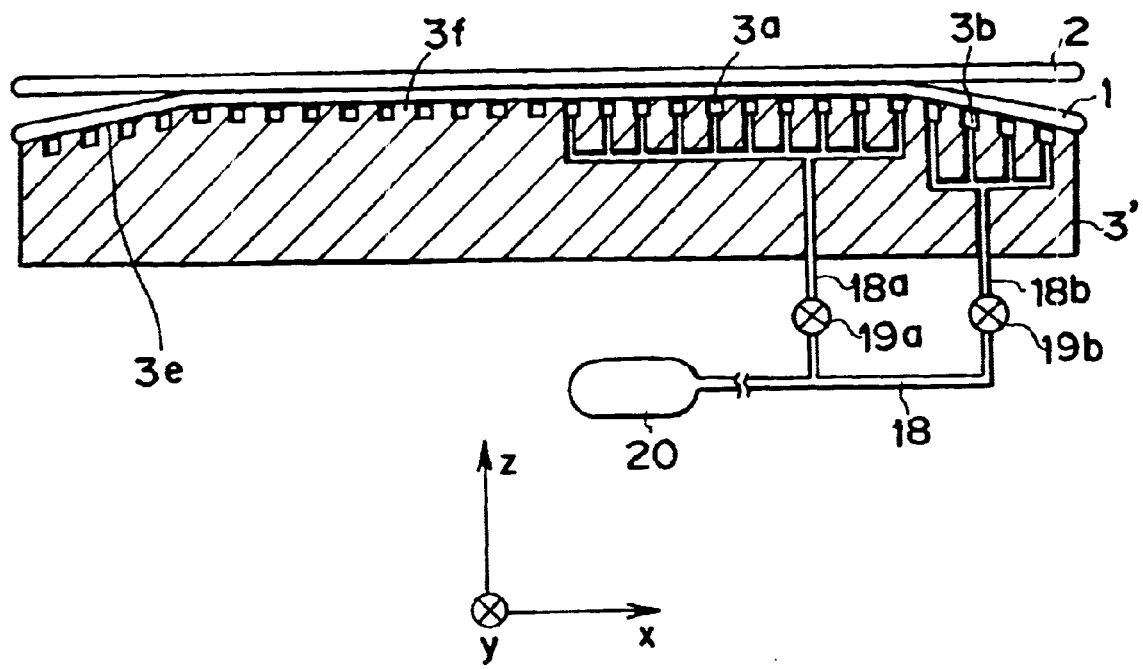
FIG. 15 is a sectional view showing the arrangement of a wafer support table according to the second embodiment.

This embodiment provides another arrangement of the wafer support table 3 according to the first embodiment. FIG. 15 is a sectional view showing the arrangement of a wafer support table 3' according to this embodiment. Note that the same reference numerals as in the first embodiment denote essentially the same parts in the second embodiment.

In this wafer support table 3', a central portion of the wafer chuck surface is a circular central surface 3f perpendicular to the axial direction (in a direction z in FIG. 15). The peripheral portion of the wafer chuck surface is an annular peripheral surface 3e inclined to the central surface 3f.

A wafer processing apparatus incorporating this wafer support table 3' in place of the wafer support table 3 also achieves the same effects as in the first embodiment.

[Third Embodiment]

Figure 16:
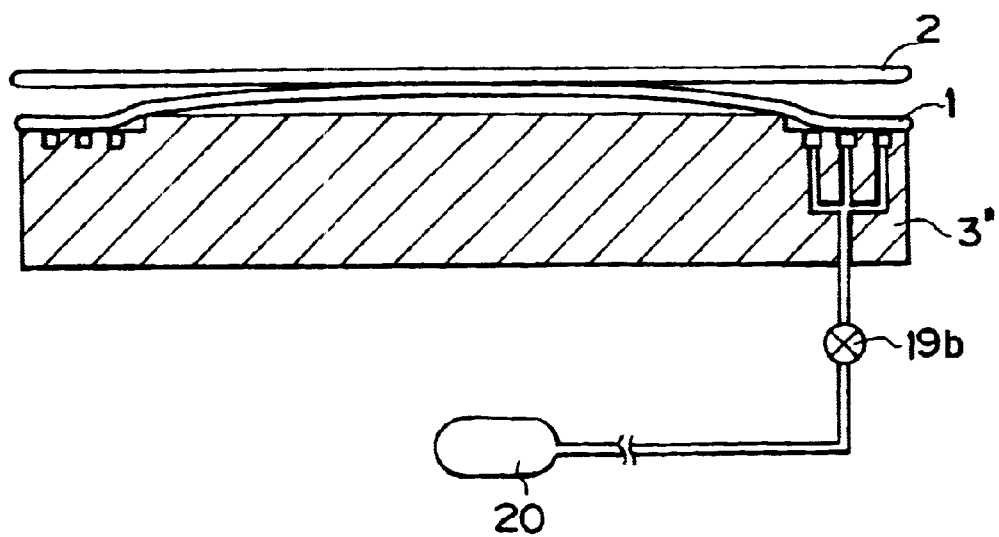
FIG. 16 is a sectional view showing the arrangement of a wafer support table according to the third embodiment.

This embodiment provides still another arrangement of the wafer support table 3 according to the first embodiment. FIG. 16 is a sectional view showing the arrangement of a wafer support table 3" according to this embodiment. Note that the same reference numerals as in the first embodiment denote essentially the same parts in the third embodiment.

This wafer support table 3" is substantially the same as the wafer support table 3 according to the first embodiment except that the chuck grooves in the central portion are omitted. When this wafer support table 3" chucks a wafer, as shown in FIG. 16, the central portion of the wafer floats surface. Therefore, even if a foreign matter exists between the chuck surface of the wafer support table 3" and the wafer, the operation is not easily affected by this foreign matter.

[Fourth Embodiment]

This embodiment provides another example of the wafer processing apparatus. In the above embodiments, the contact portion is shaped only once in the process of contacting two wafers. However, to properly contact wafers having larger diameters, it is effective to shape the contact portion twice or more. This embodiment relates to a wafer processing apparatus for adjusting the shape of the contact portion three times.

Figure 17:
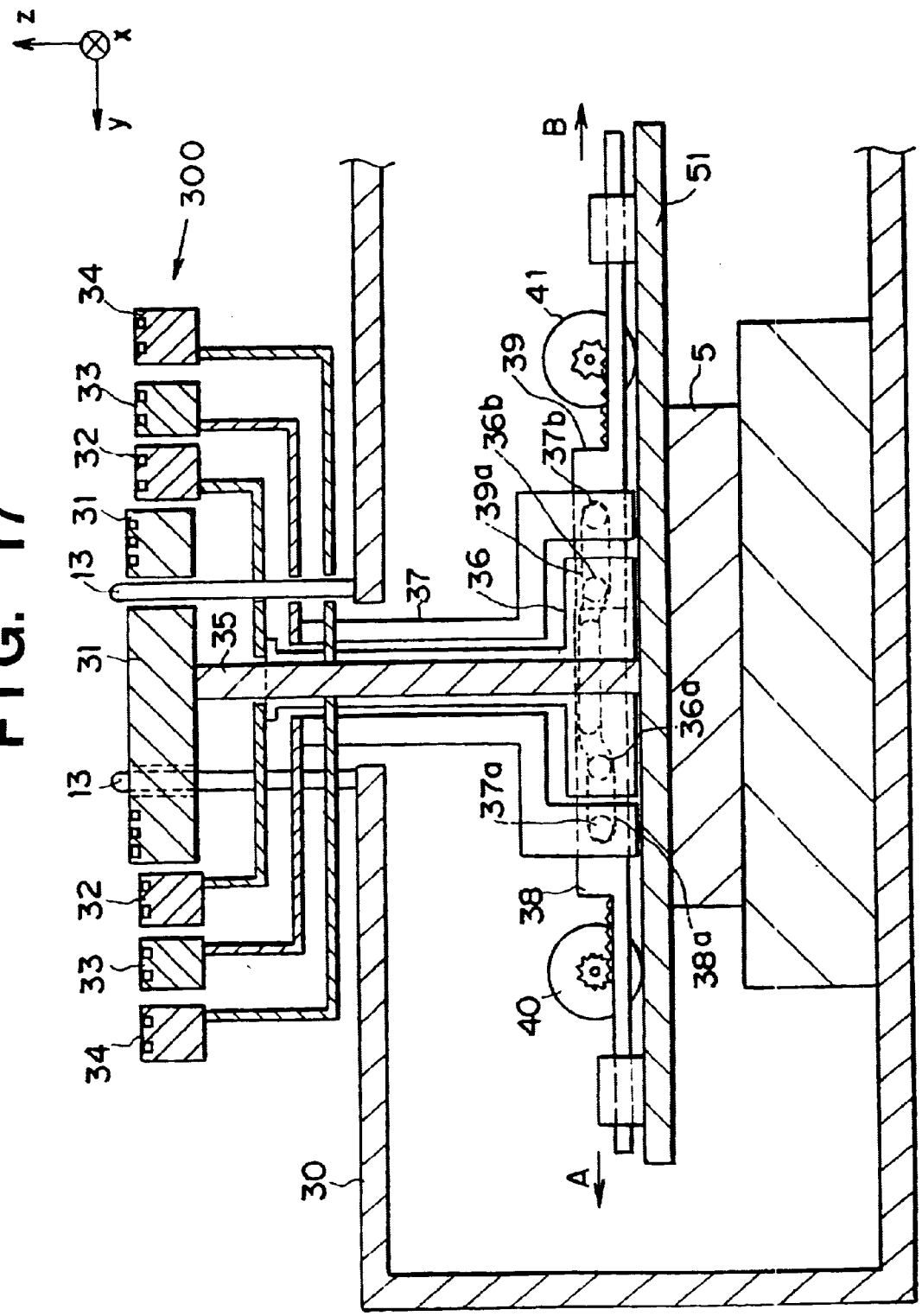
FIG. 17 is a sectional view showing the arrangement of a wafer support table according to the fourth embodiment.
Figure 18:
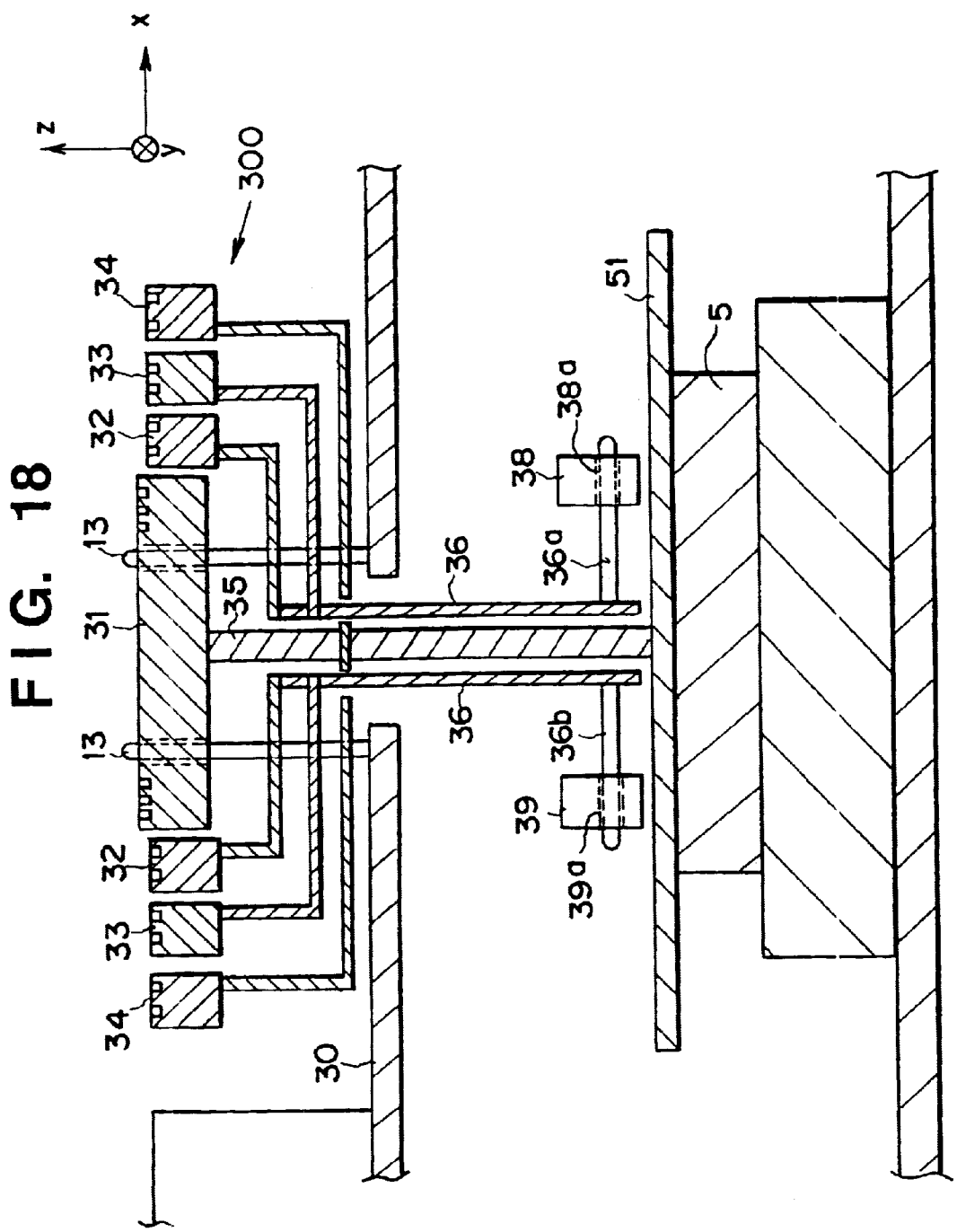
FIG. 18 is a sectional view showing the arrangement of the wafer support table according to the fourth embodiment.

FIGS. 17 and 18 are sectional views showing a part of the wafer processing apparatus according to this embodiment. The same reference numerals as in the first embodiment denote essentially the same parts in FIGS. 17 and 18. Components such as chuck holes and valves for vacuum-chucking wafers are omitted from FIGS. 17 and 18. Portions not shown in FIGS. 17 and 18 are the same as in the wafer processing apparatus 100 according to the first embodiment. That is, the wafer processing apparatus according to this embodiment is obtained by replacing the structure (wafer support table 3) on the Z-axis stage 5 in the wafer processing apparatus 100 according to the first embodiment.

In this embodiment, a wafer support table 300 comprises a first support member 31, a second support member 32, a third support member 33, and a fourth support member 34. The first support member 31 has a disk-like shape and is connected to a support table 51 by a connecting member 35. This support table 51 is fixed to a Z-axis stage 5. The second support member 32 has an annular shape surrounding the perimeter of the first support member 31 and is connected to a sliding member 36. The third support member 33 has an annular-shape surrounding the perimeter of the second support member 32 and is connected to a sliding member 37. The fourth support member 34 has an annular shape surrounding the perimeter of the third support member 33 and is connected to the first support member 31 by the connecting member 35.

The sliding member 36 connected to the second support member 32 has sliding pins 36a and 36b engaged with guide grooves 38a and 39a of racks 38 and 39, respectively. The sliding member 37 connected to the third support member 33 has sliding pins 37a and 37b engaged with the guide grooves 38a and 39a of the racks 38 and 39, respectively.

The racks 38 and 39 are moved in opposite directions (A and B) by rotations of motors 40 and 41, respectively. When the racks 38 and 39 move in the directions of arrows A and B, respectively, in the state shown in FIG. 18, the second and third support members 32 and 33 move up in this order. More specifically, the rotations of the motors 40 and 41 horizontally move the racks 38 and 39 in the directions A and B, respectively. Accordingly, the sliding pins 36a and 36b engaged with the guide grooves 38a and 39a move up to push the second support member 32 upward. Subsequently, the sliding pins 37a and 37b engaged with the guide grooves 38a and 39a move up to push the third support member 33 upward.

When the second and third support members 32 and 33 are pushed upward as described above, the chuck surfaces of the first to third support members 31 to 33 form a substantially flat surface.

On the other hand, by horizontally moving the racks 38 and 39 in opposite directions of A and B, respectively, it is possible to move the second and third support members 32 and 33 down to the state shown in FIGS. 17 and 18.

A procedure of contacting two wafers by using this wafer processing apparatus will be described below. First, a wafer transfer robot 10 (FIG. 1) loads a wafer 1 on load pins 13. Next, the Z-axis stage 5 is driven to bring the chuck surface of the first support member 31 into contact with the back surface of the wafer 1. In this step, the positions of the second and third support members 32 and 33 are so controlled that the chuck surfaces of the second to fourth support members 32 to 34 form a substantially plane surface.

In this state, a displacement detector 15 measures the thickness of the wafer 1. Also, a displacement detector 12 measures the thickness of a wafer 2 chucked by a wafer chuck unit 4c. Next, a wafer moving mechanism 41 is pivoted through about 180° on a shaft 4b to oppose the wafers 1 and 2 to each other substantially horizontally. On the basis of the previously measured thicknesses of the wafers 1 and 2, the Z-axis stage 5 adjusts the height of a wafer support table 3 to adjust the gap between the wafers 1 and 2 to a set value.

Figure 19:
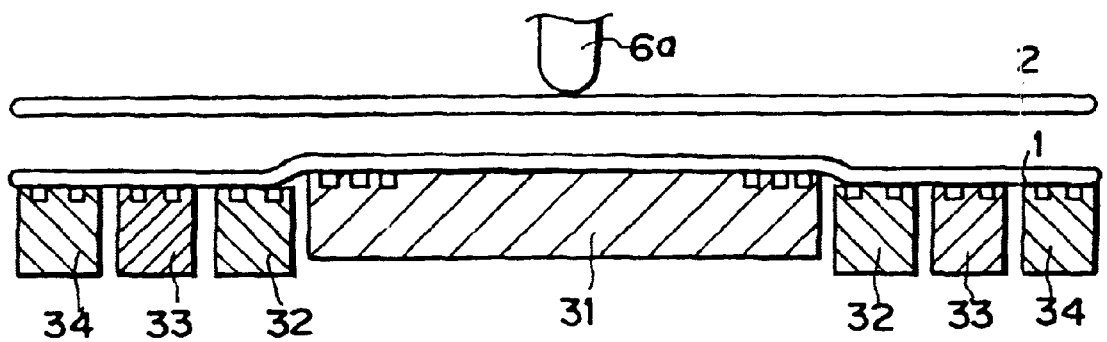
FIG. 19 is a view showing the state wherein preparations for a process of contacting two wafers are complete.

Subsequently, the spaces in chuck grooves formed in the chuck surfaces of the first to fourth support members 31 to 34 are evacuated to chuck the entire surface of the wafer 1. A press pin 6a is then pivoted on a shaft 6b to the vicinity of the back surface of the wafer 2 (e.g., a position where the press pin 6a essentially comes in contact with the back surface of the wafer 2). In this manner preparations for the process of contacting the two wafers are complete. FIG. 19 shows the state wherein preparations for the process of contacting the two wafers are complete.

Figure 20:
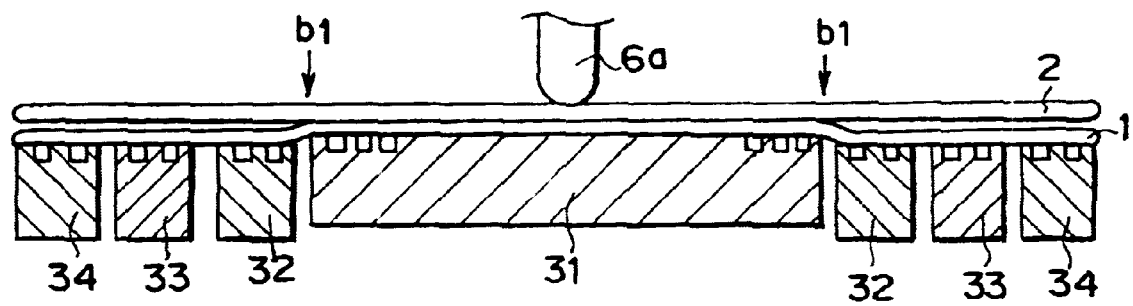
FIG. 20 is a schematic view showing the state wherein the contact portion has reached a contact boundary b1.

When the press pin 6a starts pressing, the central portions of the wafers 1 and 2 first contact. The contact portion gradually spreads toward the periphery. This spread stops when reaching a first contact boundary b1, i.e., the vicinity of the periphery of the first support member 31. The first contact boundary b1 absorbs any nonuniformity of the spread rate of the contact portion. As a consequence, the contact portion takes a substantially circular shape. FIG. 20 is a view schematically showing the state wherein the contact portion has reached the first contact boundary b1.

Figure 21:
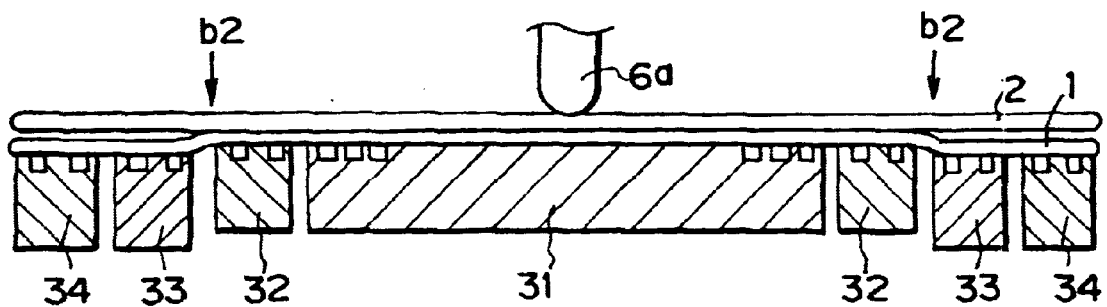
FIG. 21 is a schematic view showing the state wherein the contact portion has reached a contact boundary b2.

Next, the second support member 32 is moved up to further spreads the contact portion toward the periphery. The spread stops when reaching a second contact boundary b2, i.e., the vicinity of the outer periphery of the second support member 32. The second contact boundary b2 absorbs any nonuniformity of the spread rate of the contact portion. As a consequence, the contact portion takes a substantially circular shape. FIG. 21 is a view schematically showing the state wherein the contact portion has reached the second contact boundary b2.

Figure 22:
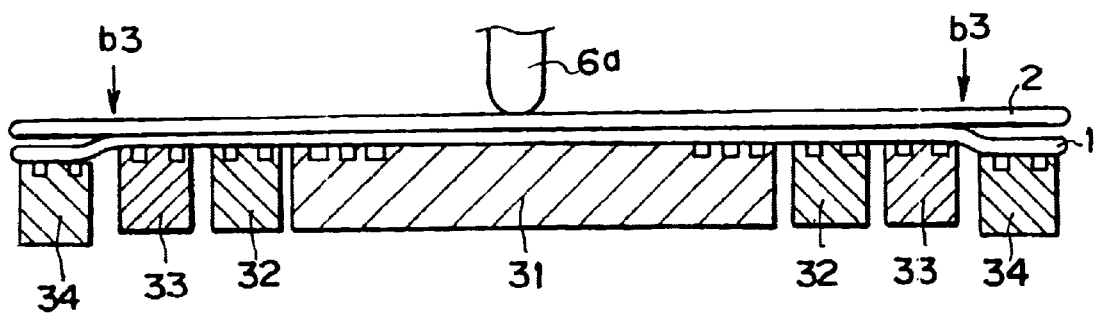
FIG. 22 is a schematic view showing the state wherein the contact portion has reached a contact boundary b3.

The third support member 33 is then moved up to further spreads the contact portion toward the periphery. The spread stops when reaching a third contact boundary b3, i.e., the vicinity of the outer periphery of the third support member 33. The third contact boundary b3 absorbs any nonuniformity of the spread rate of the contact portion. As a consequence, the contact portion takes a substantially circular shape. FIG. 22 is a view schematically showing the state wherein the contact portion has reached the third contact boundary b3.

Figure 23:
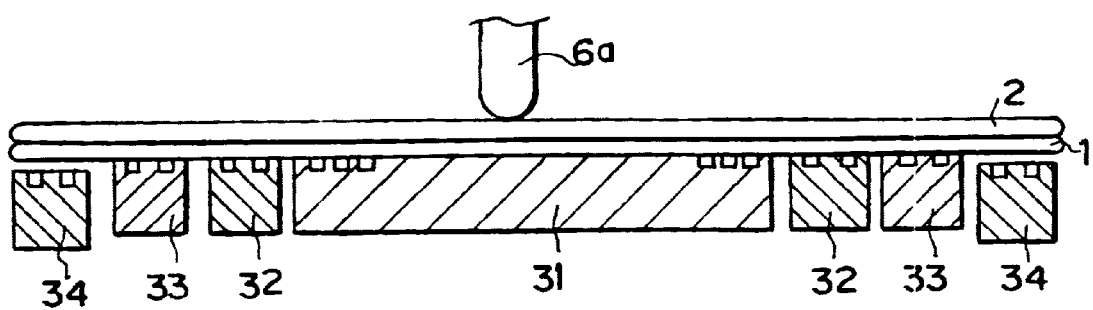
FIG. 23 is a schematic view showing the state wherein the entire surfaces of two wafers are contacted.

Subsequently, the wafer 1 is released by the chuck grooves formed in the chuck surface of the fourth support member 34. Consequently, the contact portion further spreads toward the periphery. Finally, the entire surface of the wafer 1 contacts to the wafer 2. FIG. 23 is a view schematically showing the state wherein the entire surfaces of the wafers 1 and 2 contact each other.

After a press mechanism 6 is returned to the original state, the wafer chuck unit 4c is returned to the original state. The chuck by the chuck grooves formed in the first to third support members 31 to 33 is stopped. After that, the wafer support table 30 is moved down to allow the load pins 13 to support the contacted wafers. The wafer transfer robot 10 chucks the lower portion of the contacted wafers, transfers the wafers to a wafer cassette 9, and places the wafers in the wafer cassette 9.

As described above, even large-diameter wafers can be contacted with high quality by shaping the contact portion a plurality of number of times.

[Another Embodiment]

Each of the above embodiments relates to an apparatus and a method of contacting two wafers step by step from the center to the periphery. However, the present invention is also applicable to an apparatus and a method by which arbitrary portions (e.g., portions of the peripheries) of wafers are first contacted, and the area of the contact portion is increased step by step to finally contact the entire surfaces of the two wafers.

[Application of Wafer Processing Apparatus]

An application of each of the above wafer processing apparatuses will be described below. FIGS. 24A to 24F are views showing an example of a process of fabricating a wafer having an SOI structure.

Figure 24A:
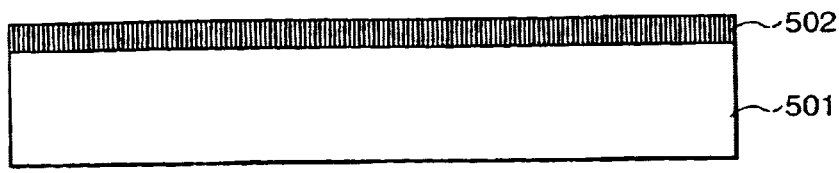
Figure 24B:
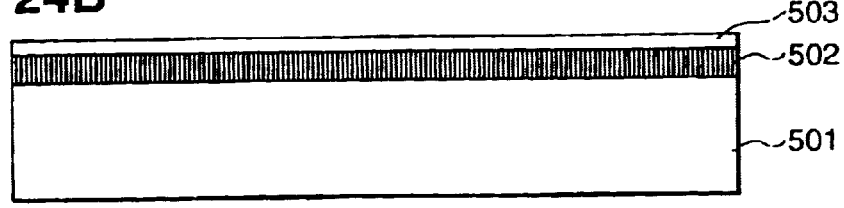

First, a single-crystal Si wafer 501 for forming a first wafer 1 is prepared, and a porous Si layer 502 is formed on the major surface of the wafer 501 (FIG. 24A). Next, at least one non-porous layer 503 is formed on the porous Si layer 502 (FIG. 24B). Preferable examples of the non-porous layer 503 are a single-crystal Si layer, a porous Si layer, an amorphous Si layer, a metal film layer, a compound semiconductor layer, and a superconductor layer. A device such as a MOSFET can also be formed in the non-porous layer 503.

Figure 24C:
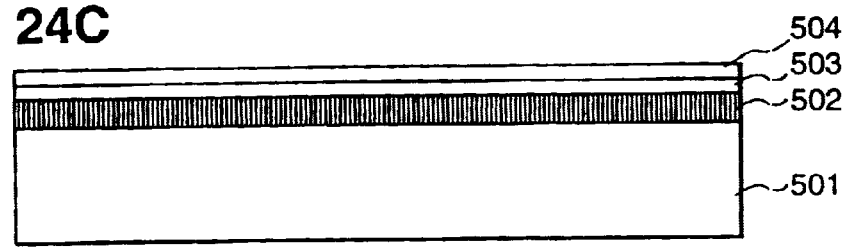

An $SiO_2$ layer 504 is formed on the non-porous layer 503 to obtain a first wafer 1 (FIG. 24C). The first wafer 1 is placed in the wafer cassette 7 such that the $SiO_2$ layer 504 is turned up.

A second wafer 2 is separately prepared and placed in the wafer cassette 8 such that the front surface is turned up.

Figure 24D:
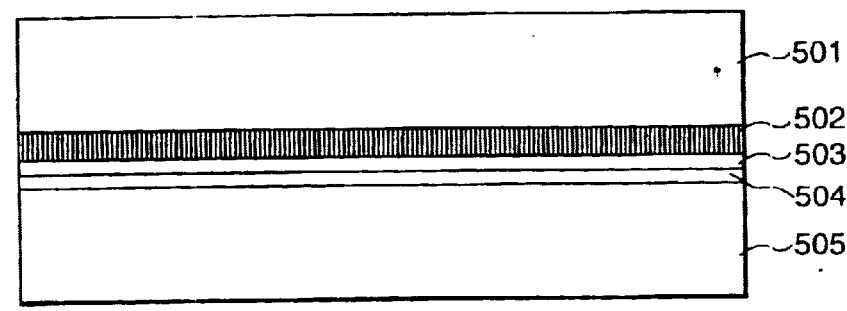
Figure 24E:
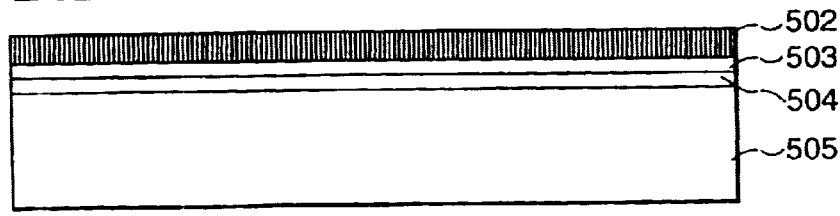

When the wafer processing apparatus is operated in this state, the first and second wafers 1 and 2 are so contacted as to sandwich the $SiO_2$ layer 504 between them on the wafer support table (FIG. 24D). The contacted wafers are placed in the wafer cassette 9.

After this process, anodization, pressing, or, if necessary, heat treatment, or a combination of these processes can also be performed for the contacted wafers (FIG. 24D) to strengthen the bonding.

Preferable examples of the second wafer 2 are an Si wafer, a wafer obtained by forming an $SiO_2$ layer on an Si wafer, a light-transmitting wafer such as a quartz wafer, and a sapphire wafer. However, the second wafer 2 can also be still another kind of wafer provided that the surface to be bonded is sufficiently flat.

Figure 24F:
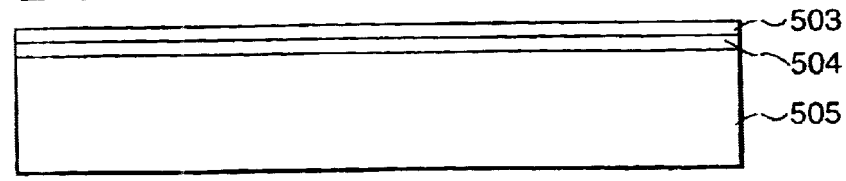

Subsequently, the first wafer 1 is removed from the porous Si layer 502 of the second wafer 2 (FIG. 24E), and the porous Si layer 502 is selectively etched away. FIG. 24F schematically shows the wafer obtained by the above fabrication method.

This fabrication method can fabricate high-quality wafers because two wafers are contacted while any gas between the wafers is appropriately discharged.

In the present invention, large-diameter substrates can be easily contacted.

The present invention is not limited to the above embodiments and various changes and modifications can be made within the spirit and scope of the present invention. Therefore, to apprise the public of the scope of the present invention the following claims are made.

What is claimed is:

1. A substrate processing apparatus for overlapping and contacting two substrates, comprising:
   a support unit for supporting a first substrate; and
   a press unit for pressing a second substrate opposed to the first substrate supported by said support unit,
   wherein said support unit can support the first substrate while a predetermined portion of the first substrate is curved as to separate from the second substrate that is not curved, and
   selectively releases said curved peripheral portion of the first substrate so that a flat contact area between said substrates takes on a substantially circular shape.

2. The apparatus according to claim 1, wherein said presses unit presses a back surface of the second substrate opposed to the first substrate by said support unit.

3. The apparatus according to claim 1, wherein said support unit can support the first substrate while a peripheral portion of the first substrate is curved as to separate from the second substrate that is not curved, and said press unit presses a substantially central portion of the second substrate opposed to the first substrate supported by said support unit.

4. The apparatus according to claim 1, wherein said support unit support the first substrate in a curved state until a predetermined time elapses after said press unit starts pressing a back surface of the second substrate, and supports the first substrate in an uncurved state thereafter.

5. The apparatus according to claim 1, wherein said support unit supports the first substrate in a curved state until a contact portion of the first and second substrates spreads to a predetermined region after said press unit starts pressing a back surface of the second substrate, and supports the first substrate in an uncurved state thereafter.

6. The apparatus according to claim 3, wherein said support unit comprises an adjusting unit for adjusting the curve of the first substrate to spread a contact portion of the first and second substrates step by step from a center to a periphery thereof.

7. The apparatus according to claim 6, wherein said adjusting unit adjusts the curve of the first substrate to spread the contact portion of the first and second substrates concentrically step by step.

8. The apparatus according to claim 1, wherein said support unit comprises a chuck unit for curving the first substrate by chucking a back surface of the first substrate.

9. The apparatus according to claim 3, wherein said support unit comprises a support table having a peripheral portion lower than a central portion, and said support table chucks the first substrate.

10. The apparatus according to claim 9, wherein said support table comprises a disk-like central portion and one or a plurality of annular peripheral portions.

11. The apparatus according to claim 9, wherein said support table comprises a disk-like central portion and an annular peripheral portion, and a chuck surface of said peripheral portion is inclined to a chuck surface of said central portion.

12. The apparatus according to claim 10, wherein a chuck surface of said central portion and a chuck surface of said peripheral portion have chuck mechanisms for chucking the first substrate.

13. The apparatus according to claim 12, wherein pins arranged in the form of a frog are used for supporting the first substrate are formed on the chuck surfaces of said central portion and/or said peripheral portion, and the first substrate is chucked by evacuating a space between said pins.

14. The apparatus according to claim 10, wherein only a chuck surface of said peripheral portion of said support table has a chuck mechanism for chucking the first substrate.

15. The apparatus according to claim 9, wherein said support table of said support unit chucks only a periphery of the first substrate to separate a central portion of the first substrate from a central portion of said support table.

16. The apparatus according to claim 1, further comprising a substrate manipulation unit for supporting the second substrate with the second substrate opposing the first substrate supported by said support unit, and releasing the second substrate, wherein said press unit presses the second substrate when said substrate manipulation unit releases the second substrate.

17. The apparatus according to claim 16, wherein said support unit substantially horizontally supports the first substrate, and said substrate manipulation unit substantially horizontally supports the second substrate above the first substrate and releases the second substrate.

18. A substrate support apparatus for supporting a first substrate when said first substrate and a second substrate are overlapped and contacted comprising:
    a support unit capable of supporting said first substrate in a curved state and said second substrate in an uncurved state, and
    selectively releasing said curved peripheral portion of said first substrate so that a flat contact area between said substrates takes on a substantially circular shape.

19. The apparatus according to claim 18, wherein said support unit can support the substrate while a periphery of the substrate is curved and a central portion of the substrate is not curved.

20. The apparatus according to claim 18, wherein said support unit supports the substrate first in a curved state and then in an uncurved state.

21. The apparatus according to claim 19, wherein said support unit comprises an adjusting unit for adjusting the curve of the substrate to spread a contact portion of the supported substrate and the other substrate to be contacted to the substrate step by step from a center to a periphery thereof.

22. The apparatus according to claim 21, wherein said adjusting unit adjusts the curve of the supported substrate to spread the contact portion concentrically step by step.

23. The apparatus according to claim 18, wherein said support unit curves the substrate by chucking a back surface of the substrate.

24. The apparatus according to claim 19, wherein said support unit comprises a support table having a peripheral portion lower than a central portion, and said support table chucks the first substrate.

25. The apparatus according to claim 24, wherein said support table comprises a disk-like central portion and one or a plurality of annular peripheral portions.

26. The apparatus according to claim 24, wherein said support table comprises a disk-like central portion and an annular peripheral portion, and a chuck surface of said peripheral portion is inclined to a chuck surface of said central portion.

27. The apparatus according to claim 25, wherein a chuck surface of said central portion and a chuck surface of said peripheral portion have chuck mechanisms for chucking the substrate.

28. The apparatus according to claim 25, wherein only a chuck surface of said peripheral portion of said support table has a chuck mechanism for chucking the substrate.

29. The apparatus according to claim 24, wherein said support table of said support unit chucks only a periphery of the substrate to separate a central portion of the substrate from a central portion of said support table.

* * * * *